US012771770B2

(12) United States Patent
Yoo

(10) Patent No.: US 12,771,770 B2
(45) Date of Patent: Oct. 20, 2026

(54) ELECTRONIC DEVICE COMPRISING STRUCTURE FOR SUPPORTING FLEXIBLE PRINTED CIRCUIT BOARD

(71) Applicant: Samsung Electronics Co., Ltd., Suwon-si (KR)

(72) Inventor: Jaejoon Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 77 days.

(21) Appl. No.: 18/924,392

(22) Filed: Oct. 23, 2024

(65) Prior Publication Data

US 2025/0047768 A1 Feb. 6, 2025

Related U.S. Application Data

(63) Continuation of application No. PCT/KR2023/002680, filed on Feb. 24, 2023.

(30) Foreign Application Priority Data

May 6, 2022 (KR) ........................ 10-2022-0056152
May 31, 2022 (KR) ........................ 10-2022-0067254

(51) Int. Cl.
*H04M 1/02* (2006.01)
*G06F 1/16* (2006.01)
(Continued)

(52) U.S. Cl.
CPC ........ *H04M 1/0277* (2013.01); *G06F 1/1637* (2013.01); *G06F 1/1652* (2013.01);
(Continued)

(58) Field of Classification Search
CPC ............. H04M 1/0277; H04M 1/0214; H04M 1/0268; H05K 1/147; H05K 1/189; G06F 1/1637; G06F 1/1652; G06F 1/1681
See application file for complete search history.

(56) References Cited

U.S. PATENT DOCUMENTS 8,373,816 B2 2/2013 Kim et al.
9,064,834 B2 6/2015 Kim et al.
(Continued)

FOREIGN PATENT DOCUMENTS

CN 113055511 A 6/2021
KR 10-2009-0060707 6/2009
(Continued)

OTHER PUBLICATIONS

Extended European Search Report dated Mar. 26, 2025, issued in a European Application No. 23799536.0.
(Continued)

*Primary Examiner* — Patrick F Marinelli
(74) *Attorney, Agent, or Firm* — Jefferson IP Law, LLP

(57) ABSTRACT

An electronic device is provided. The electronic device includes a bracket including one surface facing outside of the electronic device, another surface facing inside of the electronic device and opposite to the one surface, and a through hole penetrating the one surface and the other surface, a display disposed on the one surface of the bracket, a printed circuit board spaced apart from the other surface of the bracket in a direction toward which the other surface of the bracket faces, a flexible printed circuit board passing through the through hole and extending from one surface of the display facing the one surface of the bracket to the printed circuit board, and a supporting portion partially disposed on the through hole and is spaced apart from the one surface of the display, wherein the supporting portion is in contact with a part of a portion of the flexible printed circuit board, and wherein the supporting portion separates the part of the flexible printed circuit board passing through the through hole from the one surface of the display.

20 Claims, 16 Drawing Sheets

(51) Int. Cl.
*H05K 1/14* (2006.01)
*H05K 1/189* (2026.01)

(52) U.S. Cl.
CPC ........ *G06F 1/1681* (2013.01); *H04M 1/0214* (2013.01); *H04M 1/0216* (2013.01); *H04M 1/0268* (2013.01); *H05K 1/148* (2013.01); *H05K 1/147* (2013.01); *H05K 1/189* (2013.01)

(56) References Cited

U.S. PATENT DOCUMENTS

| | | | | |
|---|---|---|---|---|
| 10,651,419 | B2 | 5/2020 | Lee | |
| 11,019,736 | B2 * | 5/2021 | Woo | H05K 1/189 |
| 11,886,240 | B2 | 1/2024 | Bie et al. | |
| 12,058,830 | B2 * | 8/2024 | Cho | H04M 1/0214 |
| 12,200,154 | B2 * | 1/2025 | Cho | H05K 1/0283 |
| 12,537,891 | B2 * | 1/2026 | Lee | H04M 1/0216 |
| 2010/0220496 | A1 | 9/2010 | Kim | |
| 2020/0093012 | A1 * | 3/2020 | Woo | H05K 1/189 |
| 2023/0007114 | A1 * | 1/2023 | Cho | G06F 1/1683 |
| 2023/0048823 | A1 * | 2/2023 | Cho | G06F 1/1652 |
| 2023/0421681 | A1 * | 12/2023 | Cai | H04M 1/0277 |
| 2024/0106925 | A1 * | 3/2024 | Lee | H04M 1/0216 |
| 2024/0195895 | A1 | 6/2024 | Kim et al. | |
| 2024/0206055 | A1 | 6/2024 | Seo | |
| 2024/0414864 | A1 * | 12/2024 | Shim | H05K 5/0247 |
| 2025/0047768 | A1 * | 2/2025 | Yoo | G06F 1/1652 |
| 2025/0331113 | A1 * | 10/2025 | Shim | H05K 5/0247 |
| 2026/0074422 | A1 * | 3/2026 | Lee | G06F 1/1618 |
| 2026/0096042 | A1 * | 4/2026 | Jung | H04M 1/0216 |

FOREIGN PATENT DOCUMENTS

| | | | |
|---|---|---|---|
| KR | 10-2012-0055006 | | 5/2012 |
| KR | 10-2014-0082381 | | 7/2014 |
| KR | 10-1494310 | B1 | 2/2015 |
| KR | 10-2015-0041725 | A | 4/2015 |
| KR | 10-2050067 | B1 | 11/2019 |
| KR | 10-2020-0057236 | A | 5/2020 |
| KR | 10-2021-0012821 | A | 2/2021 |
| KR | 10-2021-0035148 | A | 3/2021 |
| KR | 10-2292302 | B1 | 8/2021 |
| KR | 10-2022-0008749 | A | 1/2022 |
| KR | 10-2022-0016591 | A | 2/2022 |
| WO | 2020/014865 | A1 | 1/2020 |

OTHER PUBLICATIONS

International Search Report dated Jun. 5, 2023, issued in International Patent Application No. PCT/KR2023/002680.

* cited by examiner

ELECTRONIC DEVICE COMPRISING STRUCTURE FOR SUPPORTING FLEXIBLE PRINTED CIRCUIT BOARD

CROSS-REFERENCE TO RELATED APPLICATION(S)

This application is a continuation application, claiming priority under § 365 (c), of an International application No. PCT/KR2023/002680, filed on Feb. 24, 2023, which is based on and claims the benefit of a Korean patent application number 10-2022-0056152, filed on May 6, 2022, in the Korean Intellectual Property Office, and of a Korean patent application number 10-2022-0067254, filed on May 31, 2022, in the Korean Intellectual Property Office, the disclosure of each of which is incorporated by reference herein in its entirety.

BACKGROUND

1. Field

The disclosure relates to an electronic device comprising a structure for supporting a flexible printed circuit board.

2. Description of Related Art

The electronic device may include various electronic components for providing various functions according to a user's request. The electronic components are disposed on different printed circuit boards in the electronic device, respectively, and may be electrically connected by a flexible printed circuit board connecting the different printed circuit boards.

The above information is presented as background information only to assist with an understanding of the disclosure. No determination has been made, and no assertion is made, as to whether any of the above might be applicable as prior art with regard to the disclosure.

SUMMARY

As an electronic device is miniaturized, a space for disposing printed circuit boards in the electronic device may become insufficient. Since an arrangement space in the electronic device is insufficient, a flexible printed circuit board connecting the printed circuit boards may be disposed in the electronic device in a deformed state. When an applied force caused by deformation of the flexible printed circuit board is transmitted to electronic components of the electronic device, damage may occur to at least one electronic component (e.g., a display). When the damage to the electronic components occurs, the electronic device may not be able to provide a pre-designed function to a user. The electronic device may need a structure for supporting the flexible printed circuit board.

Aspects of the disclosure are to address at least the above-mentioned problems and/or disadvantages and to provide at least the advantages described below. Accordingly, an aspect of the disclosure is to provide an electronic device comprising structure for supporting flexible printed circuit board.

Additional aspects will be set forth in part in the description which follows and, in part, will be apparent from the description, or may be learned by practice of the presented embodiments.

In accordance with an aspect of the disclosure, an electronic device is provided. The electronic device includes a bracket including one surface facing outside of the electronic device, another surface facing inside of the electronic device and opposite to the one surface, and a through hole penetrating the one surface and the other surface, a display disposed on the one surface of the bracket, a printed circuit board spaced apart from the other surface of the bracket in a direction toward which the other surface of the bracket faces, a flexible printed circuit board passing through the through hole and extending from one surface of the display facing the one surface of the bracket to the printed circuit board, a supporting portion partially disposed on the through hole and spaced apart from the one surface of the display, wherein the supporting portion is in contact with a part of the flexible printed circuit board, and wherein the supporting portion separates the part of the flexible printed circuit board passing through a though hole from the one surface of the display.

In accordance with another aspect of the disclosure, an electronic device is provided. The electronic device includes a first housing including a first surface and a second surface that faces the first surface and is spaced apart from the first surface, a second housing including a third surface and a fourth surface that faces the third surface and is spaced apart from the third surface, hinge structure capable of switching to an unfolding state in which a direction in which the first surface faces and a direction in which the third surface faces are the same or a folding state in which the first surface and the third surface face each other, by rotatably connecting the first housing and the second housing, a display disposed on the first surface and the third surface across the hinge structure, a bracket including one surface that faces outside of the first housing and is in contact with the display, another surface that faces inside of the first housing and is opposite to the one surface, and a through hole penetrating the one surface and the other surface, wherein the bracket is coupled to the first housing, a printed circuit board spaced apart from the other surface of the bracket in a direction toward which the other surface of the bracket faces, and a flexible printed circuit board including a first region being in contact with the one surface of the display facing the one surface of the bracket, and a second region passing through the through hole and extending from the first region to the printed circuit board, wherein at least a portion of the second region is bent on the other surface of the bracket, and wherein a part of the other surface of the bracket is spaced apart from the one surface of the display and separates the second region from the one surface of the display by being in contact with the second region.

According to an embodiment of the disclosure, an electronic device can reduce damage to at least one electronic component included in the electronic device due to an applied force of a flexible printed circuit board, by a structure for supporting the flexible printed circuit board.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include computer-executable instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g., a central processing unit (CPU)), a communication processor (CP, e.g., a modem), a graphical processing unit (GPU), a neural processing unit (NPU) (e.g., an artificial intelligence (AI) chip), a wireless-fidelity (Wi-Fi) chip, a Bluetooth™ chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an IC, or the like.

Figure 1:
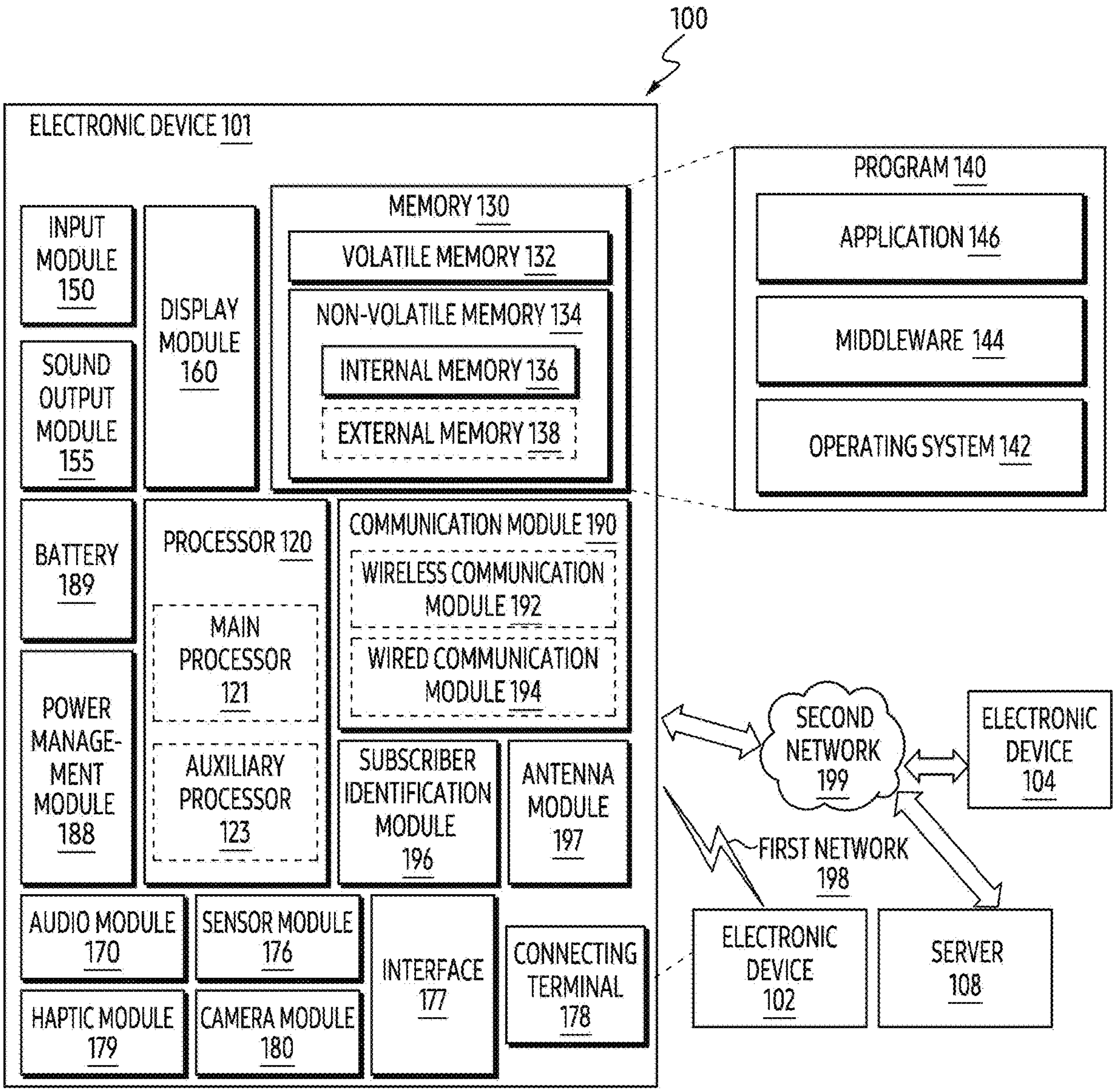
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment of the disclosure, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to an embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102 or 104 or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., a smart home, a smart city, a smart car, or healthcare) based on 5G communication technology or IoT-related technology.

Figure 2:
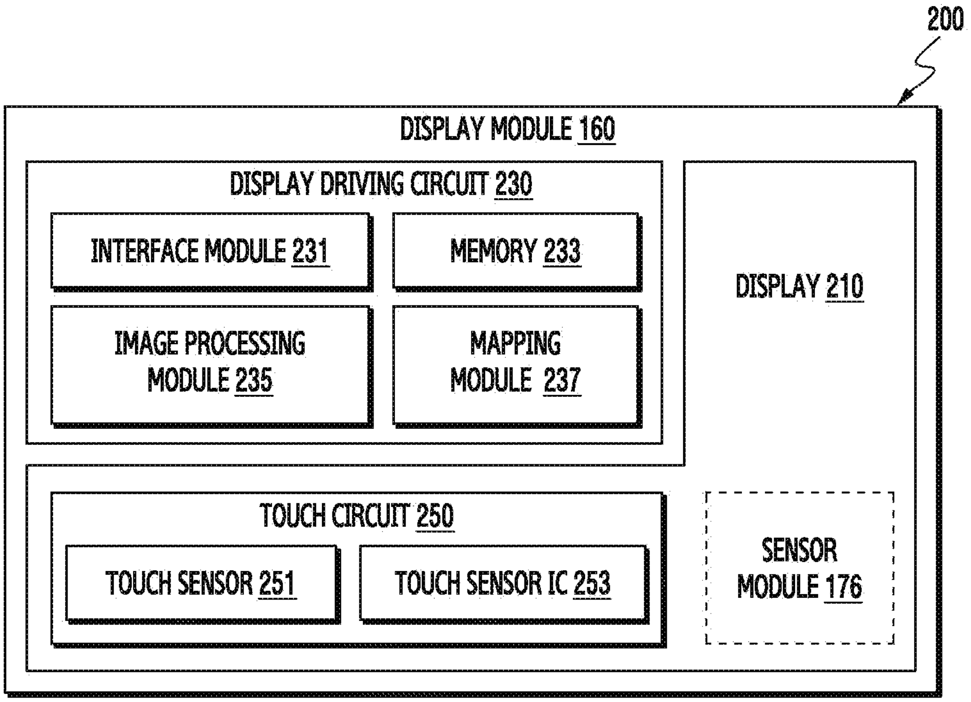
FIG. 2 is a block diagram of a display module according to an embodiment of the disclosure.

FIG. 2 is a block diagram 200 illustrating a display module according to an embodiment of the disclosure.

Referring to FIG. 2, the display module 160 may include a display 210 and a display driver integrated circuit (DDIC) 230 to control the display 210. The DDIC 230 may include an interface module 231, memory 233 (e.g., buffer memory), an image processing module 235, or a mapping module 237. The DDIC 230 may receive image information that contains image data or an image control signal corresponding to a command to control the image data from another component of the electronic device 101 via the interface module 231. For example, according to an embodiment of the disclosure, the image information may be received from the processor 120 (e.g., the main processor 121 (e.g., an application processor)) or the auxiliary processor 123 (e.g., a graphics processing unit) operated independently from the function of the main processor 121. The DDIC 230 may communicate, for example, with touch circuitry 250 or the sensor module 176 via the interface module 231. The DDIC 230 may also store at least part of the received image information in the memory 233, for example, on a frame by frame basis. The image processing module 235 may perform pre-processing or post-processing (e.g., adjustment of resolution, brightness, or size) with respect to at least part of the image data. According to an embodiment of the disclosure, the pre-processing or post-processing may be performed, for example, based at least in part on one or more characteristics of the image data or one or more characteristics of the display 210. The mapping module 237 may generate a voltage value or a current value corresponding to the image data pre-processed or post-processed by the image processing module 235. According to an embodiment of the disclosure, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment of the disclosure, the display module 160 may further include the touch circuitry 250. The touch circuitry 250 may include a touch sensor 251 and a touch sensor IC 253 to control the touch sensor 251. The touch sensor IC 253 may control the touch sensor 251 to detect a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment of the disclosure, at least part (e.g., the touch sensor IC 253) of the touch circuitry 250 may be formed as part of the display 210 or the DDIC 230, or as part of another component (e.g., the auxiliary processor 123) disposed outside the display module 160.

According to an embodiment of the disclosure, the display module 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDIC 230, or the touch circuitry 250)) of the display module 160. For example, when the sensor module 176 embedded in the display module 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display module 160 includes a pressure sensor, the pressure sensor may obtain pressure information corresponding to a touch input received via a partial or whole area of the display 210. According to an embodiment of the disclosure, the touch sensor 251 or the sensor module 176 may be disposed between pixels in a pixel layer of the display 210, or over or under the pixel layer.

Figure 3A:
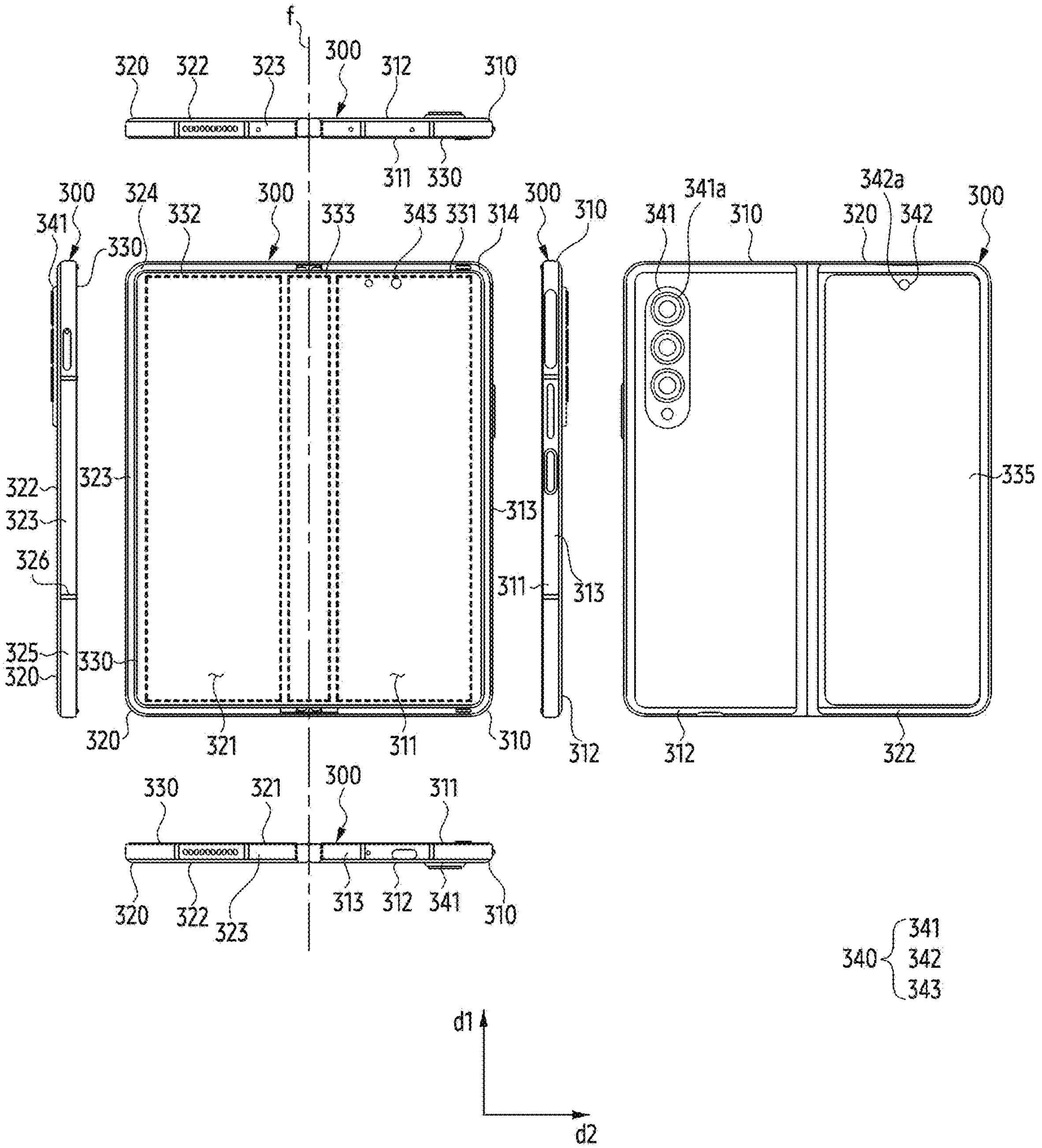
FIG. 3A illustrates an unfolding state of an electronic device according to an embodiment of the disclosure.

FIG. 3A illustrates an unfolding state of an electronic device according to an embodiment of the disclosure.

Figure 3B:
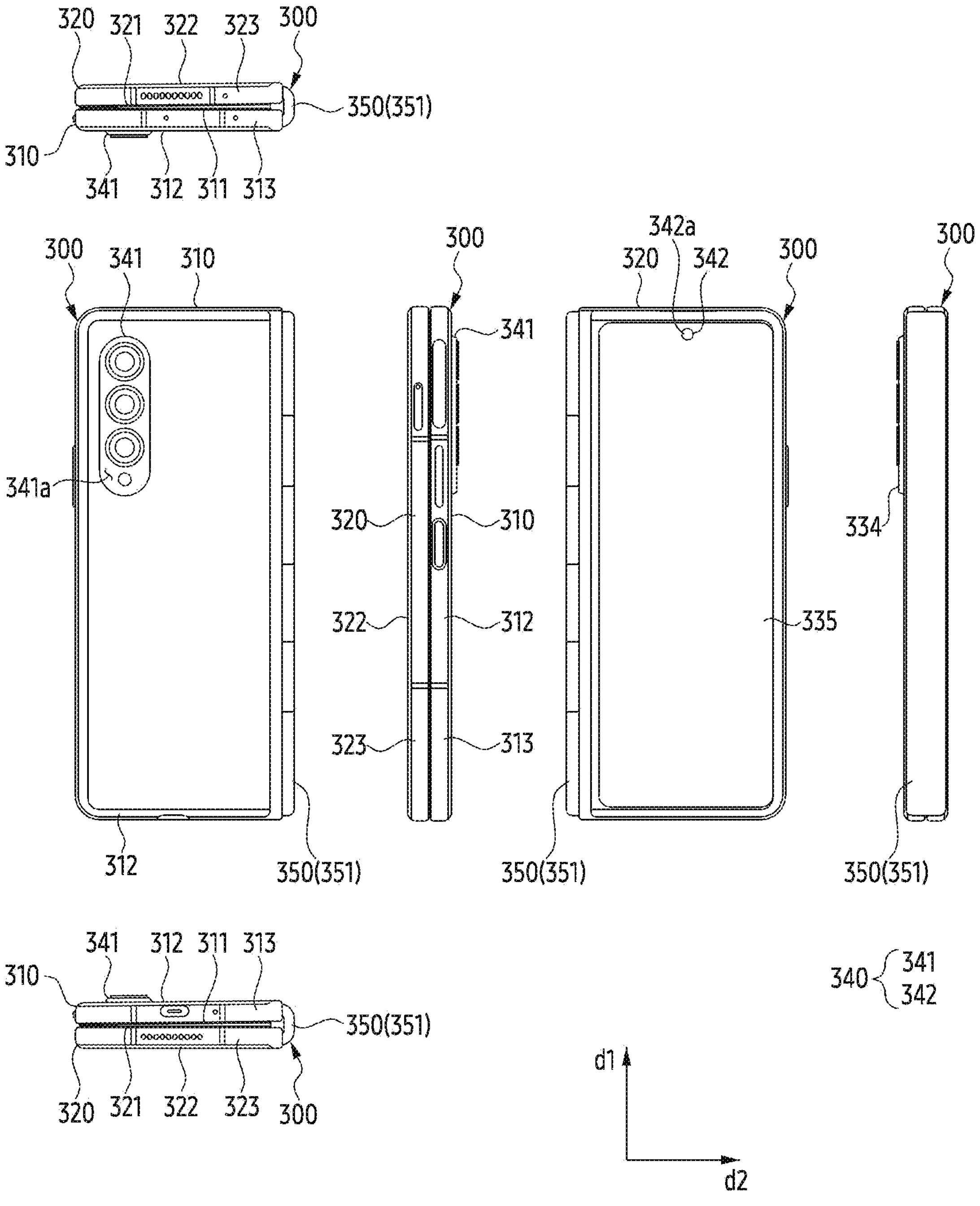
FIG. 3B illustrates a folding state of an electronic device according to an embodiment of the disclosure.

FIG. 3B illustrates a folding state of an electronic device according to an embodiment of the disclosure.

Figure 3C:
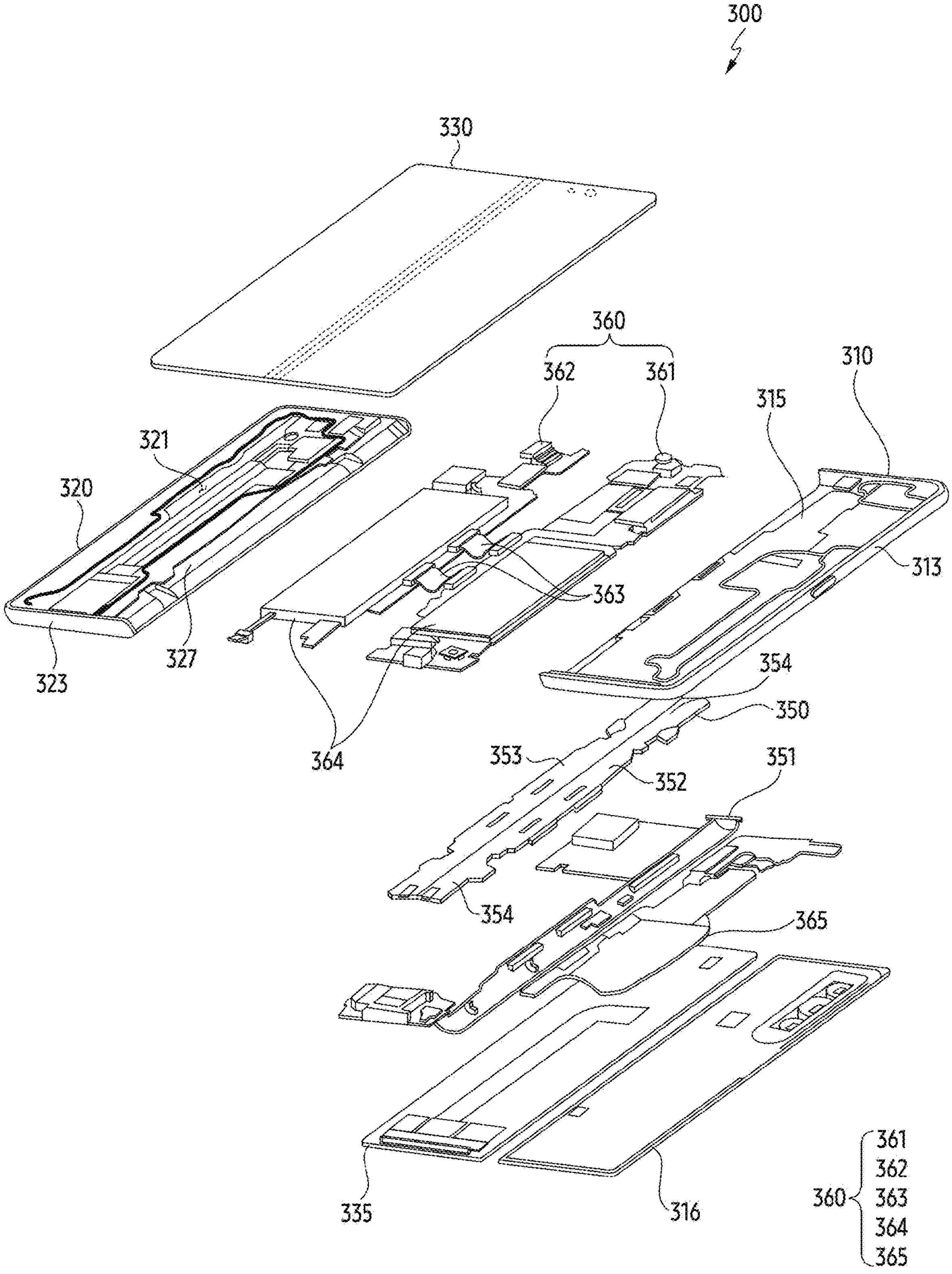
FIG. 3C is an exploded view of an electronic device according to an embodiment of the disclosure.

FIG. 3C is an exploded view of an electronic device according to an embodiment of the disclosure.

Referring to FIGS. 3A, 3B, and 3C, an electronic device 300 (e.g., the electronic device 101 of FIG. 1) may include a first housing 310, a second housing 320, a display 330 (e.g., the display 210 of FIG. 2), at least one camera 340, a hinge structure 350, and/or at least one electronic component 360.

The first housing 310 and the second housing 320 may form at least a part of an outer surface of the electronic device 300 that may be gripped by a user. The at least a part of the outer surface of the electronic device 300 defined by the first housing 310 and the second housing 320 may contact a part of the user's body, when the electronic device 300 is used by the user. According to an embodiment of the disclosure, the first housing 310 may include a first surface 311, a second surface 312 facing the first surface 311 and spaced apart from the first surface 311, and a first side surface 313 surrounding at least a part of the first surface 311 and the second surface 312. The first side surface 313 may connect a periphery of the first surface 311 and a periphery of the second surface 312. The first surface 311, the second surface 312, and the first side surface 313 may define an inner space of the first housing 310. According to an embodiment of the disclosure, the first housing 310 may provide a space formed by the first surface 311, the second surface 312, and the first side surface 313 as a space for arranging components of the electronic device 101.

According to an embodiment of the disclosure, the second housing 320 may include a third surface 321, a fourth surface 322 facing the third surface 321 and spaced apart from the third surface 321, and a second side surface 323 surrounding at least a part of the third surface 321 and the fourth surface 322. The second side surface 323 may connect a periphery of the third surface 321 and a periphery of the fourth surface 322. The third surface 321, the fourth surface 322, and the second side surface 323 may define an inner space of the second housing 320. According to an embodiment of the disclosure, the second housing 320 may provide a space formed by the third surface 321, the fourth surface 322, and the second side surface 323 surrounding at least a portion of the third surface 321 and the fourth surface 322 as a space for mounting components of the electronic device 101. According to an embodiment of the disclosure, the second housing 320 may be rotatably coupled to the first housing 310 with respect to the first housing 310.

According to an embodiment of the disclosure, each of the first housing 310 and the second housing 320 may include a first protective member 314 and a second protective member 324 respectively. The first protective member 314 and the second protective member 324 may be disposed on the first surface 311 and the third surface 321 along a periphery of the display 330. According to an embodiment of the disclosure, the first protective member 314 and the second protective member 324 may prevent the inflow of a foreign substance (e.g., dust or moisture) through a gap between the display 330, the first housing 310, and the second housing 320. For example, the first protective member 314 may surround a periphery of a first display area 331 of the display 330, and the second protective member 324 may surround a periphery of a second display area 332 of the display 330. The first protective member 314 may be formed by being attached to the first side surface 313 of the first housing 310 or may be integrally formed with the first side surface 313. The second protective member 324 may be formed by being attached to the second side surface 323 of the second housing 320 or may be integrally formed with the second side surface 323.

According to an embodiment of the disclosure, the first side surface 313 and the second side surface 323 may include a conductive material, a non-conductive material, or a combination thereof. For example, the second side surface 323 may include at least one conductive member 325 and at least one non-conductive member 326. The at least one conductive member 325 may include a plurality of conductive members spaced apart from each other. The at least one non-conductive member 326 may be disposed between the plurality of conductive members. The plurality of conductive members may be disconnected from each other, by the at least one non-conductive member 326 disposed between the plurality of conductive members. According to an embodiment of the disclosure, the plurality of conductive members and a plurality of non-conductive members may form an antenna radiator together. The electronic device 300 may communicate with an external electronic device through the antenna radiator formed by the plurality of conductive members and the plurality of non-conductive members.

The display 330 may be configured to display visual information. According to an embodiment of the disclosure, the display 330 may be disposed on the first surface 311 of the first housing 310 and the third surface 321 of the second housing 320 across the hinge structure 350. For example, the display 330 may include a first display area 331 disposed on the first surface 311 of the first housing, a second display area 332 disposed on the third surface 321 of the second housing, and a third display area 333 disposed between the first display area 331 and the second display area 332. The first display area 331, the second display area 332, and the third display area 333 may form a front surface of the display 330. According to an embodiment of the disclosure, the display 330 may further include a sub-display panel 335 disposed on the fourth surface 322 of the second housing 320. According to an embodiment of the disclosure, the display 330 may include a window exposed to the outside of the electronic device 300. The window may protect the surface of the display 330, and transmit visual information provided by the display 330 to the outside of the electronic device 300 by including a substantially transparent material. For example, the window may include glass (e.g., ultra-thin glass (UTG)) and/or a polymer (e.g., polyimide (PI)), but it is not limited thereto.

The at least one camera 340 may be configured to obtain an image, based on receiving light from an external subject of the electronic device 300. According to an embodiment of the disclosure, the at least one camera 340 may include first cameras 341, a second camera 342, and a third camera 343. The first cameras 341 may be disposed in the first housing 310. For example, the first cameras 341 may be disposed inside the first housing 310, and at least partially visible through the second surface 312 of the first housing 310. The first cameras 341 may be supported by a support member (e.g., a bracket) in the first housing 310. The first housing 310 may include at least one opening **341*a* overlapping the first cameras 341 when the electronic device 300 is viewed from above. The first cameras 341 may obtain an image based on receiving light from the outside of the electronic device 300 through the at least one opening 341*a***.

According to an embodiment of the disclosure, the second camera 342 may be disposed in the second housing 320. For example, the second camera 342 may be disposed inside the second housing 320 and visible through the sub-display panel 335. The second housing 320 may include at least one opening **342*a* overlapping the second camera 342 when the electronic device 300 is viewed from above. The second camera 342 may obtain an image based on receiving the light from the outside of the electronic device 300 through the at least one opening 342*a***.

According to an embodiment of the disclosure, the third camera 343 may be disposed in the first housing 310. For example, the third camera 343 may be disposed inside the first housing 310, and at least partially visible through the first surface 311 of the first housing 310. For another example, the third camera 343 may be disposed inside the first housing 310, and at least partially visible through the first display area 331 of the display 330. The first display area 331 of the display 330 may include at least one opening overlapping the third camera 343 when the display 330 is viewed from above. The third camera 343 may obtain an image based on receiving light from the outside of the display 330 through the at least one opening.

According to an embodiment of the disclosure, the second camera 342 and the third camera 343 may be disposed below the display 330 (e.g., a direction toward the inside of the first housing 310 or a direction toward the inside of the second housing 320). For example, the second camera 342 and the third camera 343 may be an under display camera (UDC). In case that the second camera 342 and the third camera 343 are under display cameras, an area of the display 330 corresponding to a position of each of the second camera 342 and the third camera 343 may not be an inactive area. The inactive area of the display 330 may mean an area of the display 330 that does not include a pixel or does not emit light to the outside of the electronic device 300. For another example, the second camera 342 and the third camera 343 may be punch hole cameras. In case that the second camera 342 and the third camera 343 are punch hole cameras, an area of the display 330 corresponding to a position of each of the second camera 342 and the third camera 343 may be an inactive area.

According to an embodiment of the disclosure, the hinge structure 350 may rotatably connect the first housing 310 and the second housing 320. The hinge structure 350 may be disposed between the first housing 310 and the second housing 320 of the electronic device 101, so that the electronic device 300 may be bent, curved, or folded. For example, the hinge structure 350 may be disposed between a part of the first side surface 313 and a part of the second side surface 323 facing each other. The hinge structure 350 may be capable of switching the electronic device 300 to an unfolding state in which a direction toward which the first surface 311 of the first housing 310 faces and a direction in which of the third surface 321 of the second housing 320 faces are the same or a folding state in which the first surface 311 and the third surface 321 face each other. When the electronic device 300 is in a folding state, as the first housing 310 and the second housing 320 face each other, they may be piled up or overlapped. According to an embodiment of the disclosure, when the electronic device 300 is in a folding state, a direction in which the first surface 311 faces and a direction in which the third surface 321 faces may be different from each other. For example, when the electronic device 300 is in a folding state, a direction in which the first surface 311 faces and a direction in which the third surface 321 faces may be opposite to each other. For another example, when the electronic device 300 is in a folding state, a direction in which the first surface 311 faces and a direction in which the third surface 321 faces may be inclined with respect to each other. When the direction in which the first surface 311 faces is inclined with respect to the direction in which the third surface 321 faces, the first housing 310 may be inclined with respect to the second housing 320.

According to an embodiment of the disclosure, the electronic device 300 may be foldable based on a folding axis f. The folding axis f may mean a virtual line passing a hinge cover 351 and extending in a direction (e.g., d1 of FIGS. 3A and 3B) parallel to the longitudinal direction of the electronic device 300, but it is not limited thereto. For example, the folding axis f may be a virtual line extending in a direction (e.g., d2 of FIGS. 3A and 3B) perpendicular to the longitudinal direction of the electronic device 300. In case that the folding axis f extends in a direction perpendicular to the longitudinal direction of the electronic device 300, the hinge structure 350 may extend in a direction parallel to the folding axis f to connect the first housing 310 and the second housing 320. The first housing 310 and the second housing 320 may be rotatable by the hinge structure 350 extending in a direction perpendicular to the longitudinal direction of the electronic device 300.

According to an embodiment of the disclosure, the hinge structure 350 may include the hinge cover 351, a first hinge plate 352, a second hinge plate 353, and a hinge module 354. The hinge cover 351 may surround internal components of the hinge structure 350 and form an outer surface of the hinge structure 350. According to an embodiment of the disclosure, when the electronic device 300 is in a folding state, the hinge cover 351 surrounding the hinge structure 350 may be at least partially exposed to the outside of the electronic device 300 through a gap between the first housing 310 and the second housing 320. According to another embodiment of the disclosure, when the electronic device 300 is in an unfolding state, the hinge cover 351 may be covered by the first housing 310 and the second housing 320 and may not be exposed to the outside of the electronic device 300.

According to an embodiment of the disclosure, the first hinge plate 352 and the second hinge plate 353 may rotatably connect the first housing 310 and the second housing 320 by being coupled with the first housing 310 and the second housing 320, respectively. For example, the first hinge plate 352 may be coupled to a first front bracket 315 of the first housing 310, and the second hinge plate 353 may be coupled to a second front bracket 327 of the second housing 320. As the first hinge plate 352 and the second hinge plate 353 are coupled to the first front bracket 315 and the second front bracket 327, respectively, the first housing 310 and the second housing 320 may be rotatable according to the rotation of the first hinge plate 352 and the second hinge plate 353.

The hinge module 354 may rotate the first hinge plate 352 and the second hinge plate 353. For example, the hinge module 354 may rotate the first hinge plate 352 and the second hinge plate 353 based on the folding axis f, by including gears capable of being engaged with each other and rotating. According to an embodiment of the disclosure, there may be a plurality of hinge modules 354. For example, the plurality of hinge modules 354 may be spaced apart from each other at both ends of the first hinge plate 352 and the second hinge plate 353, respectively.

According to an embodiment of the disclosure, the first housing 310 may include the first front bracket 315 and a rear bracket 316, and the second housing 320 may include the second front bracket 327. The first front bracket 315 and the rear bracket 316 may be disposed inside the first housing 310 and may support components of the electronic device 300. The second front bracket 327 may be disposed inside the second housing 320 and may support components of the electronic device 300. For example, the display 330 may be disposed on one surface of the first front bracket 315 and one surface of the second front bracket 327. The rear bracket 316 may be disposed on another surface of the first front bracket 315 facing the one surface of the first front bracket 315. The sub-display panel 335 may be disposed on the rear bracket 316.

According to an embodiment of the disclosure, a part of the first front bracket 315 may be surrounded by the first side surface 313, and a part of the second front bracket 327 may be surrounded by the second side surface 323. For example, the first front bracket 315 may be integrally formed with the first side surface 313, and the second front bracket 327 may be integrally formed with the second side surface 323. For another example, the first front bracket 315 may be formed separately from the first side surface 313, and the second front bracket 327 may be formed separately from the second side surface 323.

The at least one electronic component 360 may implement various functions to be provided to a user. According to an embodiment of the disclosure, the at least one electronic component 360 may include a first printed circuit board 361, a second printed circuit board 362, a flexible printed circuit board 363, a battery 364, and/or an antenna 365. Each of the first printed circuit board 361 and the second printed circuit board 362 may form an electrical connection between the components in the electronic device 300. For example, components (e.g., the processor 120 of FIG. 1) for implementing the overall function of the electronic device 300 may be disposed in the first printed circuit board 361, and electronic components for implementing some functions of the first printed circuit board 361 may be disposed in the second printed circuit board 362. For another example, components for operating the sub-display panel 335 disposed on the fourth surface 322 may be disposed on the second printed circuit board 362.

According to an embodiment of the disclosure, the first printed circuit board 361 may be disposed in the first housing 310. For example, the first printed circuit board 361 may be disposed on the one surface of the first front bracket 315. According to an embodiment of the disclosure, the second printed circuit board 362 may be disposed in the second housing 320. For example, the second printed circuit board 362 may be spaced apart from the first printed circuit board 361 and disposed on the one surface of the second front bracket 327. The flexible printed circuit board 363 may connect the first printed circuit board 361 and the second printed circuit board 362. For example, the flexible printed circuit board 363 may extend from the first printed circuit board 361 to the second printed circuit board 362.

The battery 364, which is a device for supplying power to at least one component of the electronic device 300, may include, for example, a non-rechargeable primary battery, or a rechargeable secondary battery, or a fuel cell. At least a part of the battery 364 may be disposed on substantially the same planar surface as the first printed circuit board 361 or the second printed circuit board 362.

The antenna 365 may be configured to receive power or a signal from the outside of the electronic device 300. According to an embodiment of the disclosure, the antenna 365 may be disposed between the rear bracket 316 and the battery 364. The antenna 365 may include, for example, a near field communication (NFC) antenna, a wireless charging antenna, and/or a magnetic secure transmission (MST) antenna. For example, the antenna 365 may perform short-range communication with an external device or wirelessly transmit and receive power required for charging.

Figure 4A:
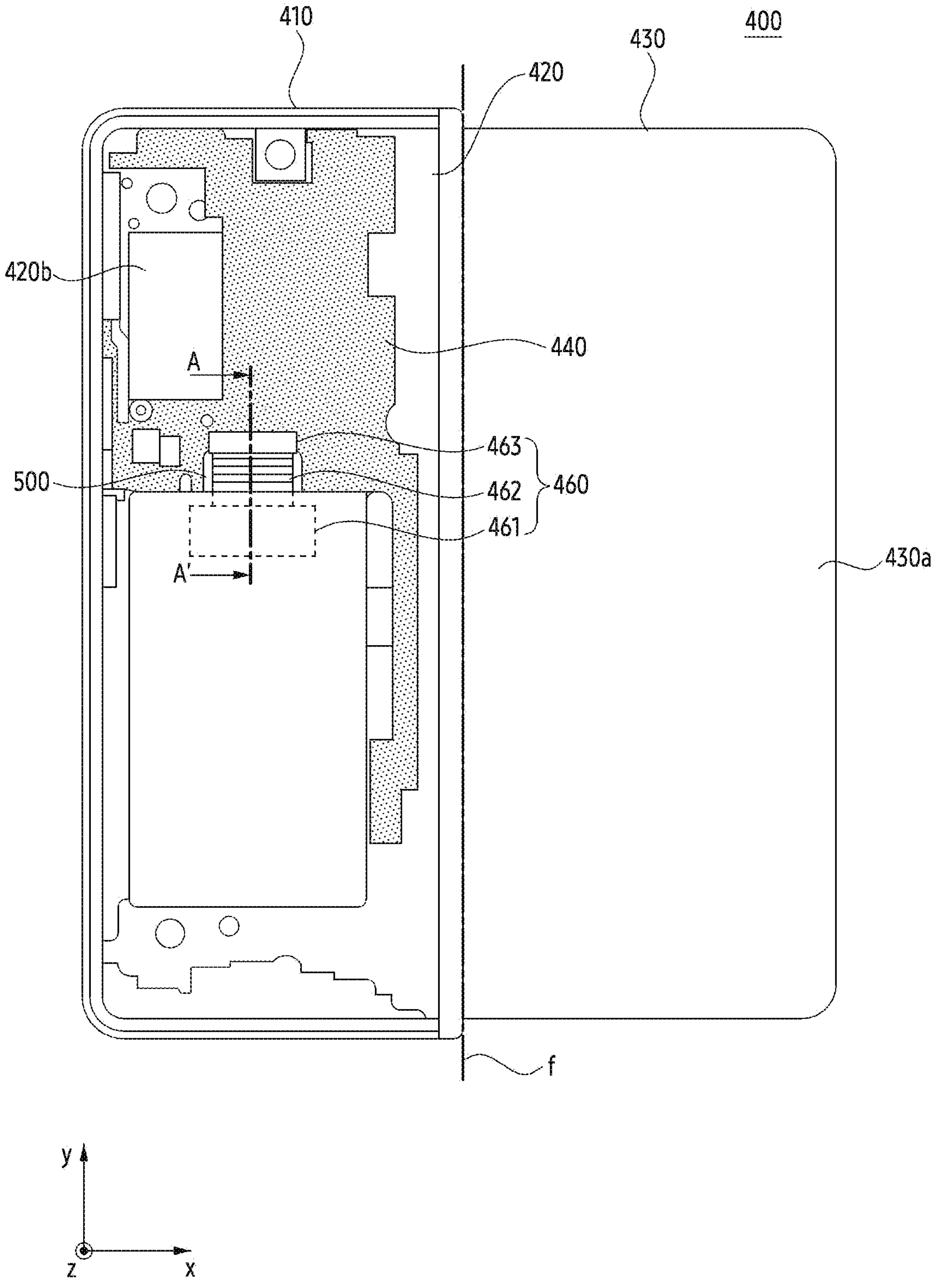
FIG. 4A is a top plan view of an electronic device according to an embodiment of the disclosure.

FIG. 4A is a top plan view of an electronic device according to an embodiment of the disclosure.

Figure 4B:
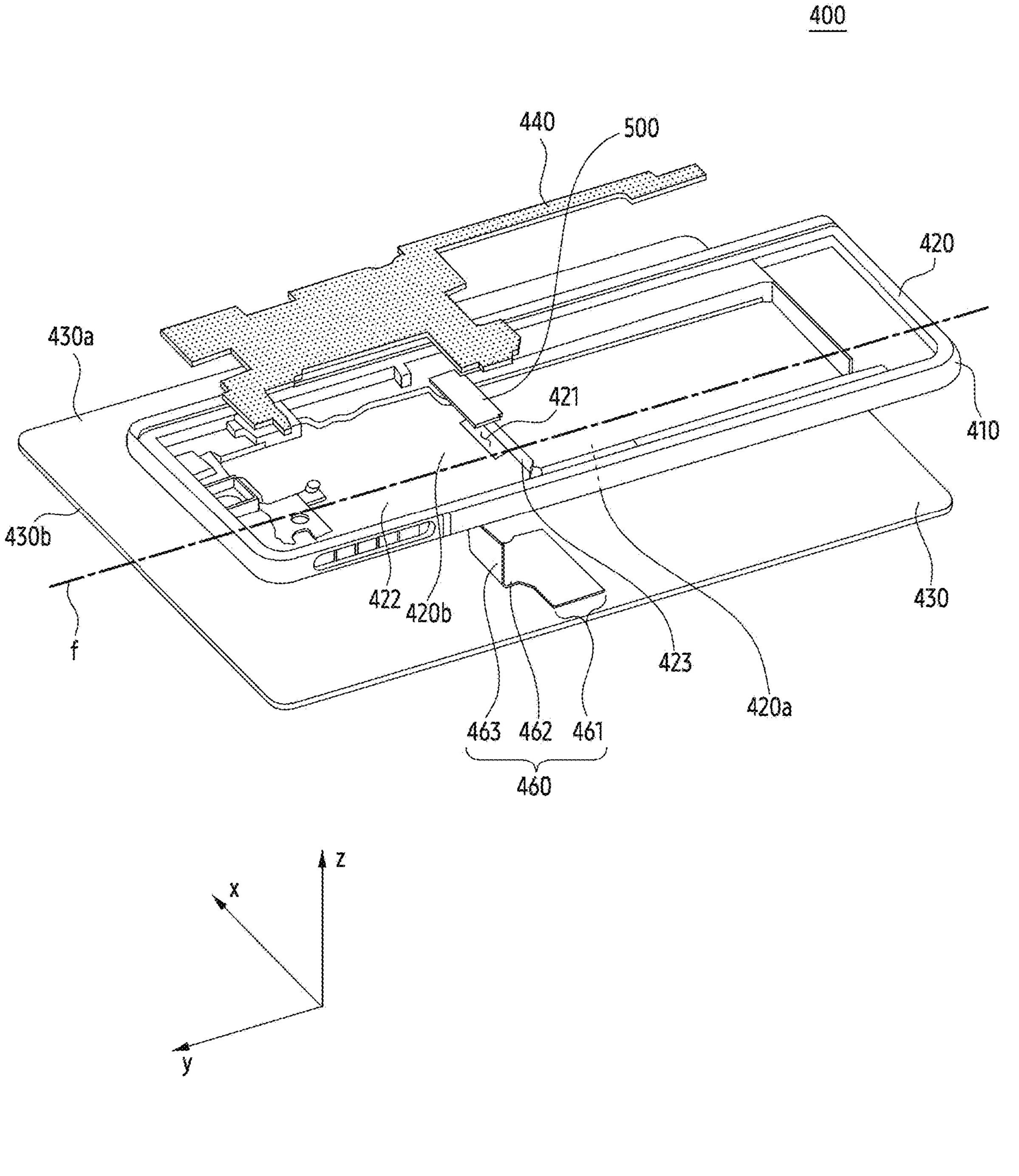
FIG. 4B is an exploded view of an electronic device according to an embodiment of the disclosure.

FIG. 4B is an exploded view of an electronic device according to an embodiment of the disclosure.

Figure 4C:
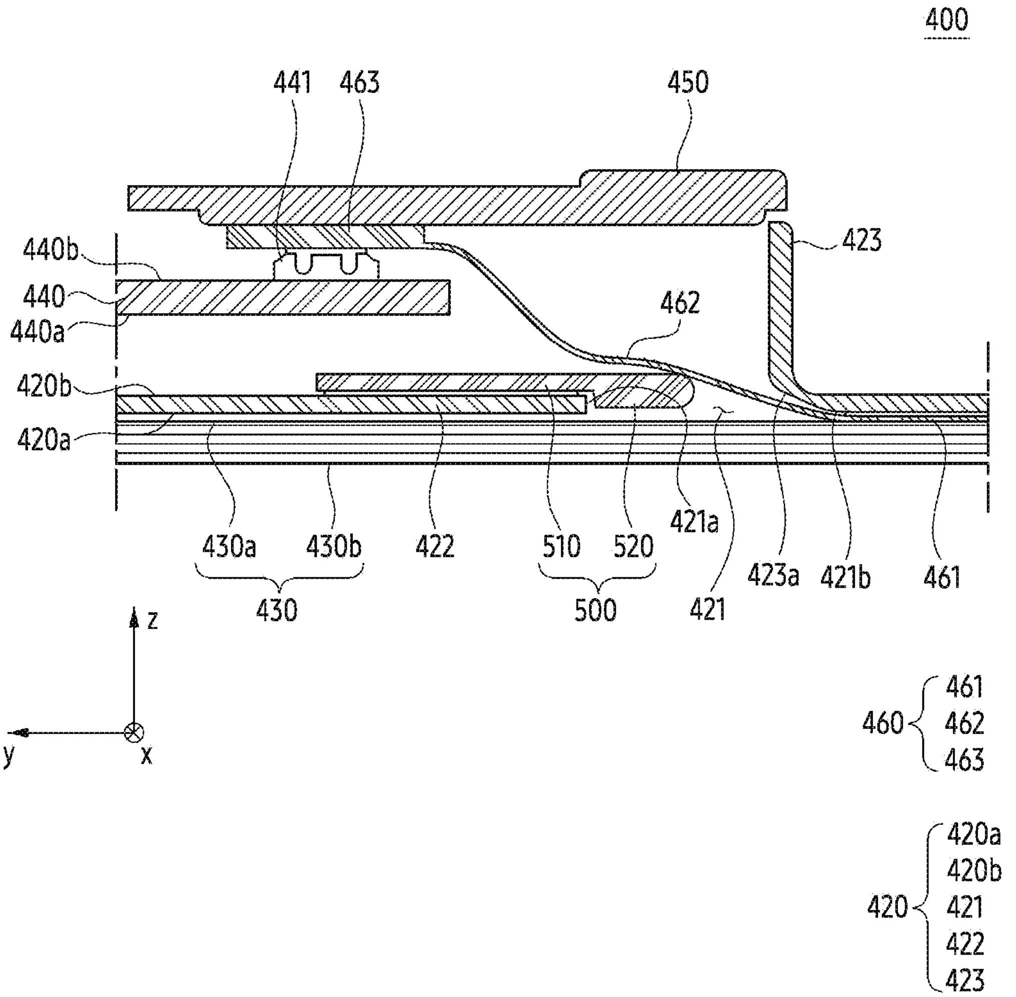
FIG. 4C is a cross-sectional view illustrating an electronic device cut along line A-A' of FIG. 4A according to an embodiment of the disclosure.

FIG. 4C is a cross-sectional view illustrating an electronic device cut along line A-A' of FIG. 4A according to an embodiment of the disclosure.

Referring to FIGS. 4A, 4B, and 4C, according to an embodiment of the disclosure, an electronic device 400 (e.g., the electronic device 101 of FIG. 1 and/or the electronic device 300 of FIGS. 3A, 3B, and 3C) may include a first housing 410 (e.g., the first housing 310 of FIGS. 3A, 3B, and 3C), a first bracket 420 (e.g., the first front bracket 315 of FIG. 3C), a display 430, a printed circuit board 440, a second bracket 450 (e.g., the rear bracket 316 of FIG. 3C), a flexible printed circuit board 460 and/or a supporting portion 500. The first housing 410, the first bracket 420, the display 430, and the second bracket 450 of FIGS. 4A, 4B, and 4C may be substantially the same as the first housing 310, the first front bracket 315, the display 330, and the rear bracket 316 of FIGS. 3A, 3B, and 3C, respectively, and thus a redundant description thereof will be omitted.

According to an embodiment of the disclosure, the first housing 410 may define at least a part of an outer surface of the electronic device 400. The first housing 410 may define an inner space for arranging various components of the electronic device 400 together with a second housing (e.g., the second housing 320 of FIGS. 3A, 3B, and 3C). The first housing 410 may be coupled to the second housing 320 to be movable with respect to the second housing 320. For example, the first housing 410 may be rotatable with respect to the second housing 320. For another example, the first housing 410 may be pivotably coupled to the second housing 320, with respect to the second housing 320.

According to an embodiment of the disclosure, the display 430 may be deformable by a movement of the first housing 410 with respect to the second housing 320. For example, by the movement of the first housing 410 with respect to the second housing 320, the display 430 may be folded or unfolded. According to an embodiment of the disclosure, the first housing 410 may have a shape extending long along a folding axis f of the electronic device 400. The first housing 410 may have a length in a direction (e.g., +y direction or −y direction) parallel to the folding axis f. However, it is not limited thereto, and the first housing 410 may have a shape extending long in a direction perpendicular to the folding shaft f.

According to an embodiment of the disclosure, the first bracket 420 may support components disposed inside the electronic device 400. For example, the first bracket 420 may include a recess for supporting the printed circuit board 440 disposed inside the first housing 410. According to an embodiment of the disclosure, the first bracket 420 may be integrally formed with the first housing 410, but it is not limited thereto. For example, the first bracket 420 may be defined as a separate member distinguished from the first housing 410.

According to an embodiment of the disclosure, the first bracket 420 may include a through hole 421, an extending portion 422, and/or a barrier portion 423. The through hole 421 may connect the outside of the first bracket 420 and the inside of the first bracket 420. The through hole 421 may provide a passage for connecting a component (e.g., the display 430) disposed outside the first bracket 420 and a component (e.g., the printed circuit board 440) disposed inside the first bracket 420. For example, the through hole 421 may penetrate one surface 420*a* of the first bracket 420 and another surface 420*b* of the first bracket 420 opposite to the one surface 420*a* of the first bracket 420. The one surface 420*a* of the first bracket 420 may mean a surface facing the outside of the electronic device 400 among surfaces of the first bracket 420. The one surface 420*a* of the first bracket 420 may mean a surface of the first bracket 420 facing a user when the electronic device 400 is gripped by the user. The other surface 420*b* of the first bracket 420 may mean a surface of the first bracket 420 facing the inside of the electronic device 400 among the surfaces of the first bracket 420. The other surface 420*b* of the first bracket 420 may face the one surface 420*a* of the first bracket 420 and may be spaced apart from the one surface 420*a* of the first bracket 420. According to an embodiment of the disclosure, the through hole 421 may extend long in a direction (e.g., +x direction or −x direction) perpendicular to the folding axis f of the electronic device 400. For example, the through hole 421 may extend in a direction perpendicular to the folding axis f and have a substantially rectangular cross section, but it is not limited thereto. A first periphery 421*a* and a second periphery 421*b* of the through hole 421 may face each other, and may be spaced apart from each other in a direction parallel to the folding axis f. The first periphery 421*a* and the second periphery 421*b* of the through hole 421 may be parallel to each other. A periphery of one component may mean a region of the one component including a boundary capable of distinguishing the one component from another component, and the corresponding expression may be used substantially the same below unless otherwise stated.

According to an embodiment of the disclosure, the extending portion 422 may define the one surface 420*a* of the first bracket 420, the other surface 420*b* of the first bracket 420, and the through hole 421. The extending portion 422 may extend in a direction parallel to one surface 430*a* of the display 430. The one surface 430*a* of the display 430 may mean a surface of the display 430 facing the one surface 420*a* of the first bracket 420 among the surfaces of the display 430.

According to an embodiment of the disclosure, the barrier portion 423 may partition an inner space within the electronic device 400. According to an embodiment of the disclosure, the barrier portion 423 may extend from the second periphery 421*b* of the through hole 421 facing the first periphery 421*a* of the through hole 421 in a direction (e.g., +z direction) perpendicular to the one surface 430*a* of the display 430. The barrier portion 423 may extend from the second periphery 421*b* of the through hole 421 in a direction perpendicular to the extending portion 422.

According to an embodiment of the disclosure, the display 430 may be disposed on the first housing 410. For example, the display 430 may be disposed on the one surface 420*a* of the first bracket 420 coupled to the first housing 410. The display 430 may be referred to as a flexible display that is deformable according to a movement of the first housing 410. Another surface 430*b* of the display 430 opposite to the one surface 430*a* of the display 430 may face the one surface 430*a* of the display 430, and may be spaced apart from the one surface 430*a* of the display 430. Light emitted from the display 430 to display visual information may be emitted to the outside of the electronic device 300 through the other surface 430*b* of the display 430.

According to an embodiment of the disclosure, the display 430 may include a plurality of layers stacked in order. For example, the plurality of layers may include a light emitting layer including a thin film transistor (TFT) and a plurality of pixels controlled by the TFT. The plurality of pixels included in the light emitting layer may emit light toward the other surface 430*b* of the display 430 based on a current or voltage supplied from the TFT. According to an embodiment of the disclosure, the electronic device 400 may include a display driving circuit. The display driving circuit may control an operation of the display 430. According to an embodiment of the disclosure, the display driving circuit may display visual information through the display 430 based on receiving a signal for displaying the visual information from a processor (e.g., the processor 120 of FIG. 1).

According to an embodiment of the disclosure, the display 430 may include sensor circuitry (e.g., the touch circuitry 250 of FIG. 2). The sensor circuitry may be configured to detect an input through the other surface 430*b* of the display 430. For example, the sensor circuitry may be configured to detect a touch input or a hovering input through the other surface 430*b* of the display 430. According to an embodiment of the disclosure, the sensor circuitry may be referred to as a digitizer configured to detect an input of an electronic pen through the other surface 430*b* of the display 430, but it is not limited thereto.

According to an embodiment of the disclosure, the printed circuit board 440 may form an electrical connection between electronic components in the electronic device 400. For example, the printed circuit board 440 may electrically connect the processor 120 disposed on the printed circuit board 440 and the display 430. According to an embodiment of the disclosure, the printed circuit board 440 may be disposed in the first housing 410. The printed circuit board 440 may be spaced apart from the other surface 420*b* of the first bracket 420 opposite to the one surface 420*a* of the first bracket 420. For example, the printed circuit board 440 may be spaced apart from the other surface 420*b* of the first bracket 420 in a direction (e.g., +z direction) toward which the other surface 420*b* of the first bracket 420 faces. According to an embodiment of the disclosure, as the printed circuit board 440 is spaced apart from the other surface 420*b* of the first bracket 420, an inner space of the electronic device 400 may be defined between the printed circuit board 440 and the one surface 420*a* of the first bracket 420. According to an embodiment of the disclosure, the printed circuit board 440 may be coupled to the first bracket 420 by a coupling member (e.g., a screw), but it is not limited thereto. According to an embodiment of the disclosure, the printed circuit board 440 may include a first connector 441. The first connector 441 may connect the flexible printed circuit board 460 and the printed circuit board 440. For example, the first connector 441 may be disposed on another surface 440*b* of the printed circuit board 440 opposite to one surface 440*a* of the printed circuit board 440 facing the other surface 420*b* of the first bracket 420. For another example, the first connector 441 may be disposed on the other surface 440*b* of the printed circuit board 440 facing the second bracket 450.

According to an embodiment of the disclosure, the second bracket 450 may support the components in the electronic device 400. The second bracket 450 may surround the first bracket 420. For example, the second bracket 450 may be disposed on the other surface 420*b* of the first bracket 420 and coupled to the first bracket 420. According to an embodiment of the disclosure, a part of the second bracket 450 may be substantially parallel to the extending portion 422 of the first bracket 420 and may face the printed circuit board 440. The printed circuit board 440 may be disposed between the other surface 420*b* of the first bracket 420 and the second bracket 450.

According to an embodiment of the disclosure, the flexible printed circuit board 460 may connect the display 430 and the printed circuit board 440. For example, the flexible printed circuit board 460 may electrically connect the display driving circuit of the display 430 and the processor 120 of the printed circuit board 440. The display driving circuit may receive a signal for displaying visual information from the processor 120 disposed on the printed circuit board 440 through the flexible printed circuit board 460. For another example, the flexible printed circuit board 460 may electrically connect the sensor circuitry of the display 430 and the processor 120 of the printed circuit board 440. The processor 120 disposed on the printed circuit board 440 may identify an input on the other surface 430*b* of the display 430 detected through the sensor circuitry, based on receiving another signal from a sensor through the flexible printed circuit board 460.

According to an embodiment of the disclosure, the flexible printed circuit board 460 may pass through the through hole 421 and extend from the one surface 430*a* of the display 430 to the printed circuit board 440. According to an embodiment of the disclosure, the flexible printed circuit board 460 may include a first region 461, a second region 462 connected to the first region 461, and a second connector 463. The first region 461 may mean a part of the flexible printed circuit board 460 in contact with the one surface 430*a* of the display 430. The first region 461 may be parallel to the one surface 430*a* of the display 430. The second region 462 may mean another part of the flexible printed circuit board 460 extending from the first region 461 to the printed circuit board 440. For example, the second region 462 may extend from the first region 461 in contact with the one surface 430*a* of the display 430 and pass through the through hole 421. For another example, the second region 462 may extend from the second periphery 421*b* of the through hole 421 and pass through the through hole 421. The second region 462 that has passed through the through hole 421 may pass through the inner space of the electronic device 400 and extend onto the other surface 440*b* of the printed circuit board 440. The second connector 463 may be disposed at one end of the second region 462 facing the printed circuit board 440. The second connector 463 may be coupled to the first connector 441 of the printed circuit board 440. According to an embodiment of the disclosure, the second connector 463 may be in contact with one surface of the second bracket 450 facing the other surface 440*b* of the printed circuit board 440.

According to an embodiment of the disclosure, the second region 462 may have a slope with respect to the one surface 430*a* of the display 430. For example, at least a part of the second region 462 may be inclined with respect to the one surface 430*a* of the display 430 and pass through the through hole 421. For another example, the at least a part of the second region 462 may have a curvature by being bent. According to an embodiment of the disclosure, the first region 461 may be spaced apart from the printed circuit board 440 when the display 430 is viewed from above (e.g., −z direction or +z direction). For example, when the flexible printed circuit board 460 extends from the display 430 to the printed circuit board 440, as a curvature of the flexible printed circuit board 460 changes rapidly, the magnitude of stress generated inside of the flexible printed circuit board 460 may increase. In case that the first region 461 overlaps the printed circuit board 440 when the display 430 is viewed from above (e.g., −z direction or +z direction), the curvature of the second region 462 connecting the display 430 and the printed circuit board 440 may change rapidly. According to an embodiment of the disclosure, since the first region 461 does not overlap the printed circuit board 440 when the display 430 is viewed from above, the electronic device 400 may provide a structure in which the curvature of the second region 462 is smoothly changed.

According to an embodiment of the disclosure, one surface 423*a* of the barrier portion 423 facing a part of the flexible printed circuit board 460 passing through the through hole 421 may have a slope with respect to the one surface 430*a* of the display 430. The one surface 423*a* of the barrier portion 423 may define the second periphery 421*b* of the through hole 421. For example, the one surface 423*a* of the barrier portion 423 may include an inclined surface inclined with respect to the one surface 430*a* of the display 430. The one surface 423*a* of the barrier portion 423 may be formed through chamfering to include the inclined surface. For another example, the one surface 423*a* of the barrier portion 423 may include a curved surface having a different slope of points of each surface 423*a* of the barrier portion 423 with respect to the one surface 430*a* of the display 430. In case that the one surface 423*a* of the barrier portion 423 does not have a slope, a curvature of the part of the flexible printed circuit board 460 adjacent to the one surface 423*a* of the barrier portion 423 may change rapidly. According to an embodiment of the disclosure, the electronic device 400 may provide a structure in which a curvature of the flexible printed circuit board 460 is smoothly changed by the one surface 423*a* of the barrier portion 423 having a slope with respect to the one surface 430*a* of the display 430.

The supporting portion 500 may support the flexible printed circuit board 460. According to an embodiment of the disclosure, the supporting portion 500 may separate the part of the flexible printed circuit board 460 passing through the through hole 421 from the one surface 430*a* of the display 430. For example, the supporting portion 500 may be in contact with the part of the second region 462 passing through the through hole 421. The part of the flexible printed circuit board 460 disposed between the printed circuit board 440 and the first periphery 421*a* of the through hole 421 may be spaced apart from the other surface 420*b* of the first bracket 420 by the supporting portion 500. According to an embodiment of the disclosure, a part of the supporting portion 500 may be disposed on the through hole 421. Another part of the supporting portion 500 may be disposed on the other surface 420*b* of the first bracket 420. According to an embodiment of the disclosure, the supporting portion 500 may mean a member that is defined separately from the first bracket 420 and coupled to the first bracket 420, but it is not limited thereto. The supporting portion 500 may be integrally formed with the first bracket 420. In case that the supporting portion 500 is integrally formed with the first bracket 420, the supporting portion 500 may mean one region of the first bracket 420 in contact with the part of the flexible printed circuit board 460 passing through the through hole 421. For example, the supporting portion 500 may include a polymer substance (e.g., polycarbonate (PC), or polyethylene terephthalate (PET)), rubber, metal, and glass as a material, but it is not limited thereto.

According to an embodiment of the disclosure, the supporting portion 500 may prevent an applied force generated by deformation of the flexible printed circuit board 460 from being transmitted to the display 430. For example, the flexible printed circuit board 460 may be disposed in the electronic device 400 in a state deformed by an external force. After the flexible printed circuit board 460 is deformed, the applied force of the flexible printed circuit board 460 may be transmitted to other components adjacent to the flexible printed circuit board 460. For example, in case that an applied force of the flexible printed circuit board 460 is transmitted to the display 430, a part of the display 430 may be deformed by the applied force. When the part of the display 430 is deformed, the display 430 may not smoothly transmit visual information to a user. According to an embodiment of the disclosure, the electronic device 400 may provide a structure capable of preventing an applied force of the flexible printed circuit board 460 from being transmitted to the display 430, by the supporting portion 500 in contact with the part of the flexible printed circuit board 460 passing through the through hole 421.

According to an embodiment of the disclosure, the supporting portion 500 may be spaced apart from the one surface 430*a* of the display 430. For example, in case that the supporting portion 500 supports the flexible printed circuit board 460 in a state of being in contact with the display 430, the applied force of the flexible printed circuit board 460 may be transmitted to the display 430 through the supporting portion 500. For another example, in case that the supporting portion 500 is in contact with the display 430, damage of the display 430 may occur due to the contact between the display 430 and the supporting portion 500 generated during an assembly process of the supporting portion 500. According to an embodiment of the disclosure, the electronic device 400 may provide a structure capable of preventing the damage of the display 430, by the supporting portion 500 spaced apart from the one surface 430*a* of the display 430.

According to an embodiment of the disclosure, the supporting portion 500 may include a first supporting portion 510 in contact with the other surface 420*b* of the first bracket 420 and a second supporting portion 520 connected to the first supporting portion 510 and disposed on the through hole 421. A part of the first supporting portion 510 may be disposed between the display 430 and the printed circuit board 440. The second supporting portion 520 may be disposed inside the through hole 421 and may be in contact with a part of the flexible printed circuit board 460. For example, the second supporting portion 520 may be in contact with an inner surface of the through hole 421 that defines the first periphery 421*a* of the through hole 421. The second supporting portion 520 may face the one surface 430*a* of the display 430 and may be spaced apart from the one surface 430*a* of the display 430.

According to an embodiment of the disclosure, a thickness of the second supporting portion 520 may be greater than a thickness of the first supporting portion 510. The thickness of the first supporting portion 510 and the thickness of the second supporting portion 520 may mean a length in a direction (e.g., +z direction) from the one surface 420*a* of the first bracket 420 toward the other surface 420*b* of the first bracket 420. In case that the thickness of the second supporting portion 520 is greater than the thickness of the first supporting portion 510, the second supporting portion 520 may have sufficient rigidity to resist an applied force of the flexible printed circuit board 460. According to an embodiment of the disclosure, the thickness of the second supporting portion 520 may be greater than the thickness of the first supporting portion 510 and less than the sum of the thickness of the first supporting portion 510 and the thickness of the extending portion 422, so that the second supporting portion 520 is spaced apart from the one surface 430*a* of the display 430. For example, in case that the thickness of the second supporting portion 520 is greater than or equal to the sum of the thickness of the first supporting portion 510 and the thickness of the extending portion 422, the second supporting portion 520 may be in contact with the one surface 430*a* of the display 430. In case that the second supporting portion 520 is in contact with the one surface 430*a* of the display 430, the applied force of the flexible printed circuit board 460 may be transmitted to the display 430. According to an embodiment of the disclosure, the electronic device 400 may provide a structure capable of preventing damage of the display 430, by the second supporting portion 520 having a thickness less than the sum of the thickness of the first supporting portion 510 and the thickness of the extending portion 422.

As described above, the electronic device 400 according to an embodiment of the disclosure may provide a structure capable of preventing the damage of the display 430, by the supporting portion 500 that is spaced apart from the display 430 and prevents the transmission of the applied force of the flexible printed circuit board 460 to the display 430.

Meanwhile, FIGS. 4A, 4B, and 4C illustrate that the second housing 320 is omitted from the electronic device 400, but this is for convenience of explanation. The descriptions of FIGS. 4A, 4B, and 4C may be applied substantially equally to the second housing 320.

Figure 5A:
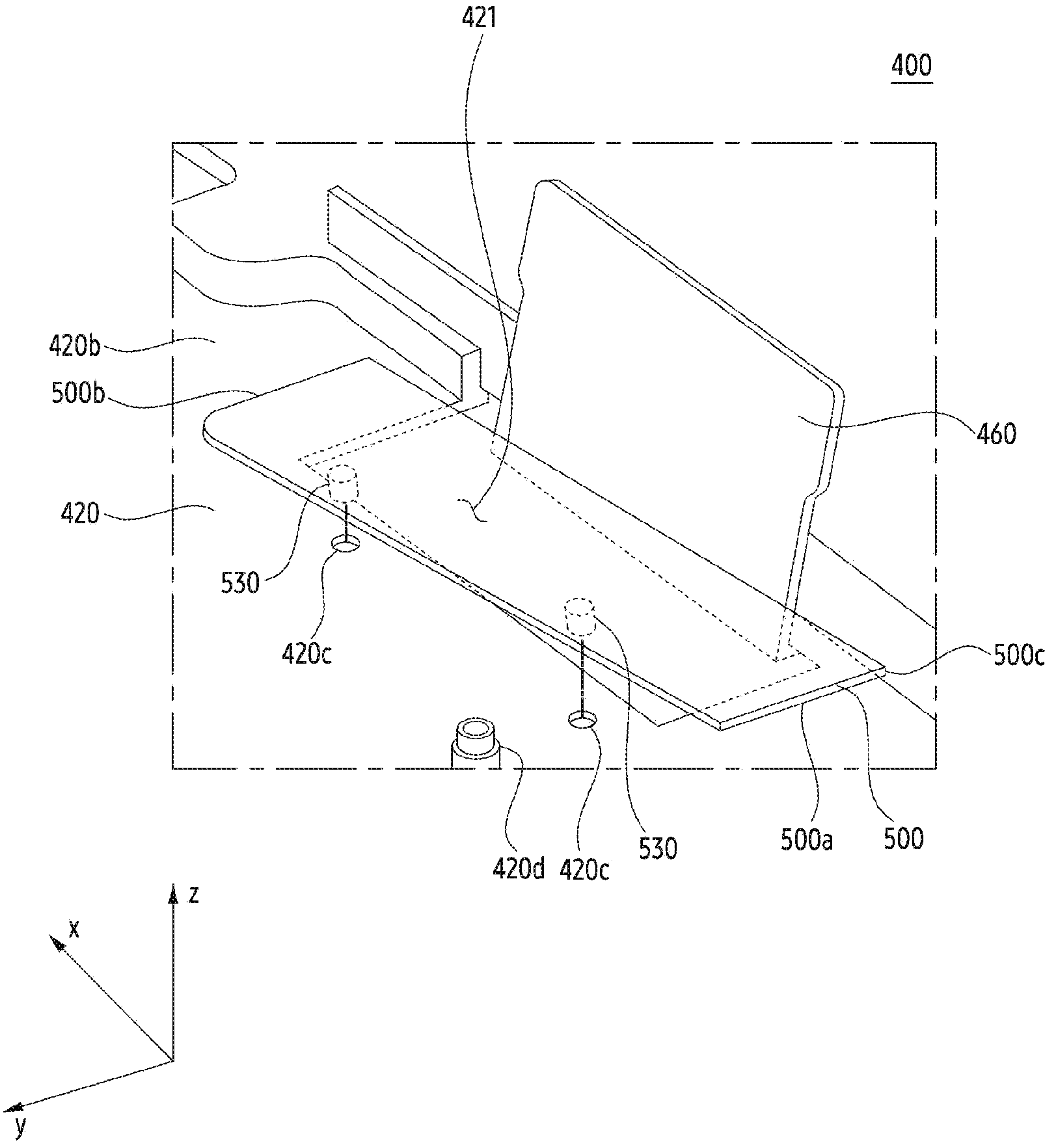
FIG. 5A illustrates a through hole and a supporting portion according to an embodiment of the disclosure.

FIG. 5A illustrates a through hole and a supporting portion according to an embodiment of the disclosure.

Figure 5B:
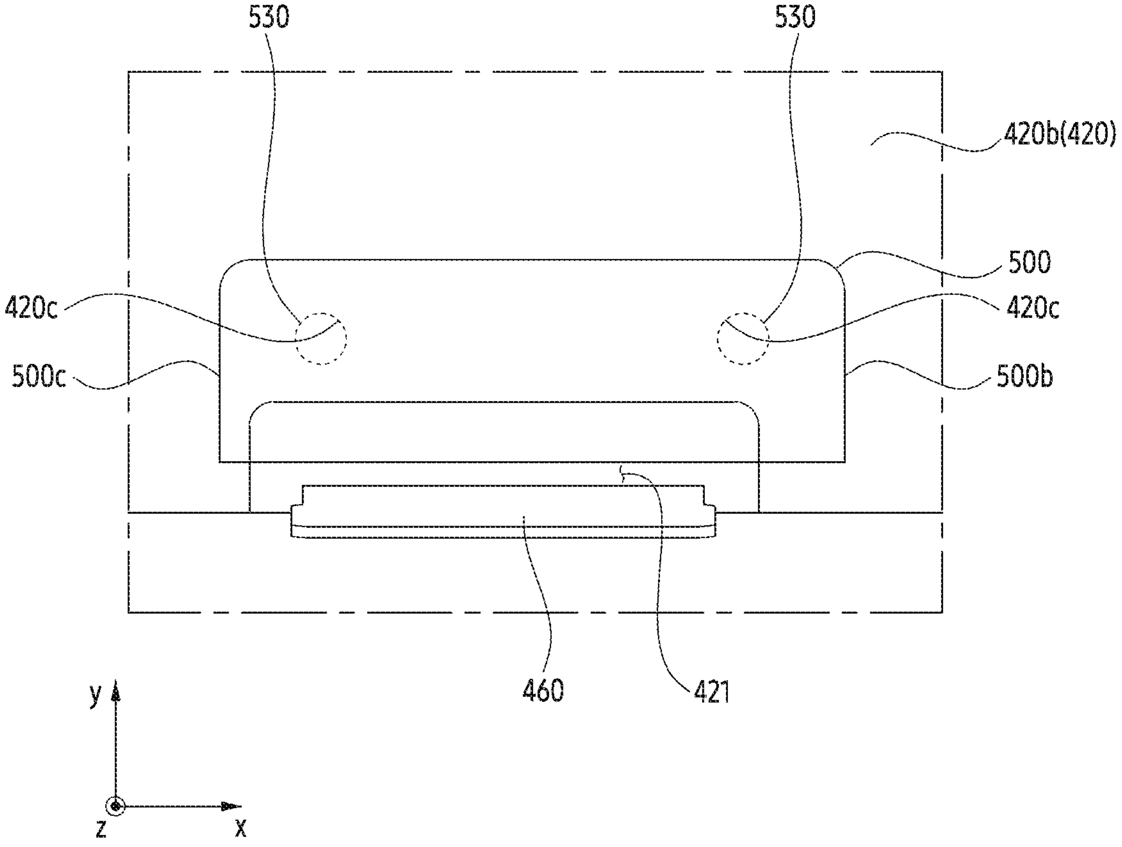
FIG. 5B is a top plan view of a through hole and a supporting portion according to an embodiment of the disclosure.

FIG. 5B is a top plan view of a through hole and a supporting portion according to an embodiment of the disclosure.

Figure 5C:
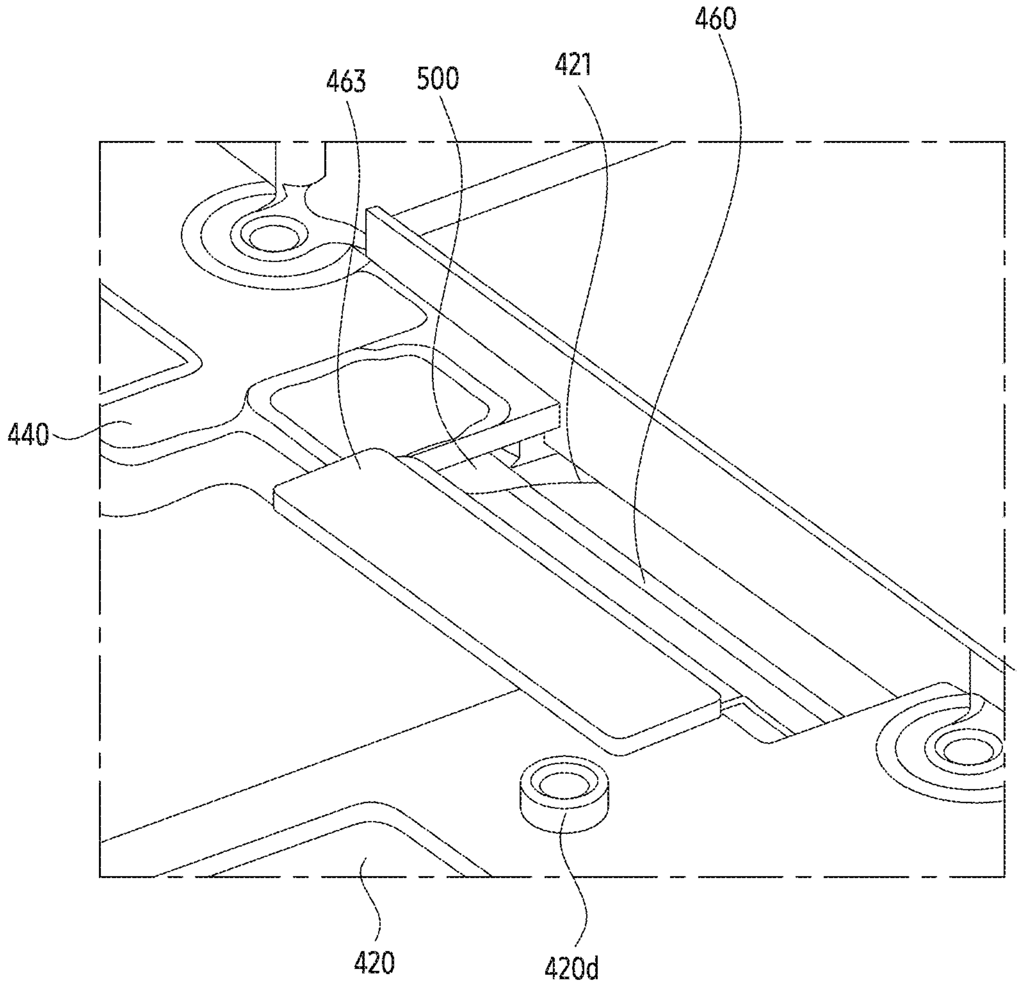
FIG. 5C illustrates a supporting portion and a printed circuit board are coupled to a first bracket, respectively according to an embodiment of the disclosure.

FIG. 5C illustrates a supporting portion and a printed circuit board are coupled to a first bracket, respectively according to an embodiment of the disclosure.

FIGS. 5A, 5B, and/or 5C illustrate a state before a supporting portion 500 and a flexible printed circuit board 460 are assembled, respectively.

Referring to FIGS. 5A, 5B, and 5C, according to the embodiment of the disclosure, width of a supporting portion 500 may be longer than width of a through hole 421. The width of the supporting portion 500 and the width of the through hole 421 may mean a length in a direction (e.g., +x direction or −x direction) parallel to another surface 420*b* of a first bracket 420. In case that the width of the supporting portion 500 is longer than the width of the through hole 421, a part of the supporting portion 500 may be in contact with a part of the other surface 420*b* of the first bracket 420 surrounding the through hole 421. For example, in case that the width of the supporting portion 500 is shorter than the width of the through hole 421, when the supporting portion 500 is coupled to the first bracket 420, at least a part of the supporting portion 500 may pass through the through hole 421. For another example, in case that the width of the supporting portion 500 is shorter than the width of the through hole 421, contact extent between the supporting portion 500 and the other surface 420*b* of the first bracket 420 surrounding the through hole 421 may be reduced. When the contact extent between the supporting portion 500 and the first bracket 420 is reduced, the supporting portion 500 may move by an applied force of the flexible printed circuit board 460 and pass through the through hole 421. When the at least a part of the supporting portion 500 passes through the through hole 421, the at least a part of the supporting portion 500 may be in contact with the display (e.g., the display 430 of FIGS. 4A, 4B and 4C), thereby damaging the display 430. According to an embodiment of the disclosure, the electronic device (e.g., the electronic device 400 of FIGS. 4A, 4B, and 4C) may provide a structure capable of preventing damage of the display 430, by the supporting portion 500 having a width longer than that of the through hole 421.

According to an embodiment of the disclosure, the supporting portion 500 may include a supporting protrusion 530 protruding from one surface 500*a* of the supporting portion 500 facing the other surface 420*b* of the first bracket 420. For example, the supporting protrusion 530 may protrude from the one surface 500*a* of the supporting portion 500 in a direction perpendicular to the other surface 420*b* of the first bracket 420. According to an embodiment of the disclosure, the first bracket 420 may include a supporting groove 420*c* disposed on the other surface 420*b* of the first bracket 420 and accommodating the supporting protrusion 530. For example, the supporting groove 420*c* may be formed as a part of the other surface 420*b* of the first bracket 420 is dented in a direction perpendicular to the other surface 420*b* of the first bracket 420. When the supporting portion 500 is coupled to the first bracket 420, the supporting protrusion 530 may be inserted into the supporting groove 420*c*. As the supporting protrusion 530 is inserted into the supporting groove 420*c*, a position of the supporting portion 500 on the first bracket 420 may be fixed. According to an embodiment of the disclosure, a size of the supporting protrusion 530 may correspond to a size of the supporting groove 420*c*. For example, in a state that the supporting protrusion 530 is coupled to the supporting groove 420*c*, a gap between the supporting protrusion 530 and the supporting groove 420*c* may be 0.05 mm to 1 mm, but it is not limited thereto.

According to an embodiment of the disclosure, the supporting portion 500 may be disposed in the first bracket 420 after the flexible printed circuit board 460 is inserted into the through hole 421. The supporting portion 500 may be inclined with respect to the other surface 420*b* of the first bracket 420 before being coupled to the first bracket 420. For example, before the supporting portion 500 is coupled to the first bracket 420, one end 500*b* of the supporting portion 500 may be in contact with the other surface 420*b* of the first bracket 420, and another end 500*c* of the supporting portion 500 facing the one end 500*b* of the supporting portion 500 may be spaced apart from the other surface 420*b* of the first bracket 420. Before the supporting portion 500 and the first bracket 420 are coupled, a position of the supporting portion 500 may be adjusted in a state that the one end 500*b* of the supporting portion 500 is in contact with the other surface 420*b* of the first bracket 420. As the one end 500*b* of the supporting portion 500 is in contact with the other surface 420*b* of the first bracket 420, the supporting portion 500 may be prevented from passing through the through hole 421 in a process of assembling the supporting portion 500 and the first bracket 420. After the position of the supporting portion 500 is adjusted, the supporting protrusion 530 may be inserted into the supporting groove 420*c*. As the support protrusion 530 is inserted into the support groove 420*c*, the supporting portion 500 and the first bracket 420 may be coupled to each other. After the supporting portion 500 and the first bracket 420 are coupled, the printed circuit board 440 may be coupled to the first bracket 420. For example, the printed circuit board 440 may be coupled to the first bracket 420 through a coupling portion 420*d* protruding from the other surface 420*b* of the first bracket 420. The coupling portion 420*d* may extend from the other surface 420*b* of the first bracket 420 in a direction toward which the other surface 420*b* of the first bracket 420 faces. After a part of the printed circuit board 440 is seated on the coupling portion 420*d*, the printed circuit board 440 and the first bracket 420 may be coupled through a coupling member (e.g., a screw). After the printed circuit board 440 and the first bracket 420 are coupled, the flexible printed circuit board 460 may be coupled to the printed circuit board 440 through a second connector 463.

Meanwhile, in FIGS. 5A and 5B, it is illustrated that the supporting protrusion 530 is disposed in the supporting portion 500 and the supporting groove 420*c* is disposed in the first bracket 420, but this is for convenience of explanation. According to embodiments of the disclosure, the supporting protrusion 530 may be disposed in the first bracket 420 and the supporting groove 420*c* may be disposed in the supporting portion 500.

As described above, the electronic device 400 according to an embodiment of the disclosure may provide a structure capable of preventing damage to the display 430, by the supporting portion 500 having a width longer than that of the through hole 421.

Figure 6:
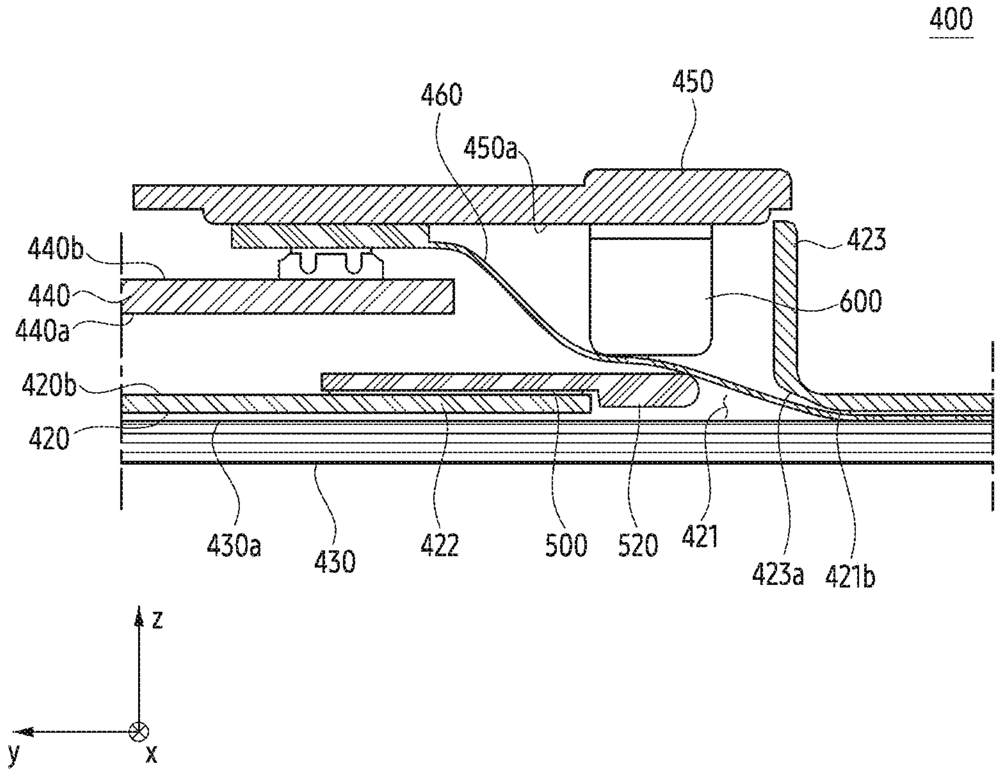
FIG. 6 is a cross-sectional view illustrating cutting an electronic device according to an embodiment of the disclosure.

FIG. 6 is a cross-sectional view illustrating cutting an electronic device according to an embodiment of the disclosure.

Referring to FIG. 6, the electronic device 400 may be an electronic device 400 to which a fixing portion 600 is added at the electronic device 400 of FIGS. 4A, 4B, and/or 4C, and thus a redundant description thereof will be omitted.

The electronic device 400 according to an embodiment of the disclosure may further include a fixing portion 600. The fixing portion 600 may support the flexible printed circuit board 460 by pressing a flexible printed circuit board 460. For example, the fixing portion 600 may extend from one surface 450*a* of a second bracket 450 facing another surface 420*b* of a first bracket 420 in a direction (e.g., z direction) that is directed to the other surface 420*b* of the first bracket 420. According to an embodiment of the disclosure, the fixing portion 600 may be in contact with the flexible printed circuit board 460. For example, the fixing portion 600 may be in contact with a part of the flexible printed circuit board 460 passing through a through hole 421. According to an embodiment of the disclosure, the fixing portion 600 may face a part of the supporting portion 500 disposed on the through hole 421. For example, the fixing portion 600 may face a second supporting portion 520 in contact with the part of the flexible printed circuit board 460. The flexible printed circuit board 460 may pass between the second supporting portion 520 and the fixing portion 600 and extend to the printed circuit board 440. According to an embodiment of the disclosure, the fixing portion 600 may mean a member that is defined separately from the second bracket 450 and coupled to the second bracket 450, but it is not limited thereto. For example, the fixing portion 600 may be integrally formed with the second bracket 450. In case that the fixing portion 600 is integrally formed with the second bracket 450, the fixing portion 600 may mean one region of the second bracket 450 in contact with the part of the flexible printed circuit board 460 passing through the through hole 421. For example, the fixing portion 600 may include a polymer substance (e.g., polycarbonate (PC), or polyethylene terephthalate (PET)), rubber, metal, or glass as a material, but it is not limited thereto.

According to an embodiment of the disclosure, the fixing portion 600 may prevent the flexible printed circuit board 460 from pressing one surface 430*a* of a display 430. For example, the fixing portion 600 may separate the part of the flexible printed circuit board 460 disposed between the second supporting portion 520 and one surface 423*a* of a barrier portion 423 from one surface 430*c* of the display 430, by pressing the flexible printed circuit board 460. In case that there is no fixing portion 600, the part of the flexible printed circuit board 460 disposed between the second supporting portion 520 and a second periphery 421*b* of the through hole 421 may be in contact with the one surface 430*a* of the display 430. In case that the part of the flexible printed circuit board 460 is in contact with the one surface 430*a* of the display 430, an applied force of the flexible printed circuit board 460 may be transmitted to the display 430, and damage of the display 430 may occur. According to an embodiment of the disclosure, the electronic device 400 may provide a structure in which the flexible printed circuit board 460 and the one surface 430*a* of the display 430 are spaced apart, by the fixing portion 600 pressing the part of the flexible printed circuit board 460.

As described above, the electronic device 400 according to an embodiment of the disclosure may provide a structure capable of preventing damage of the display 430 due to the flexible printed circuit board 460, by the fixing portion 600 pressing the flexible printed circuit board 460.

Figure 7A:
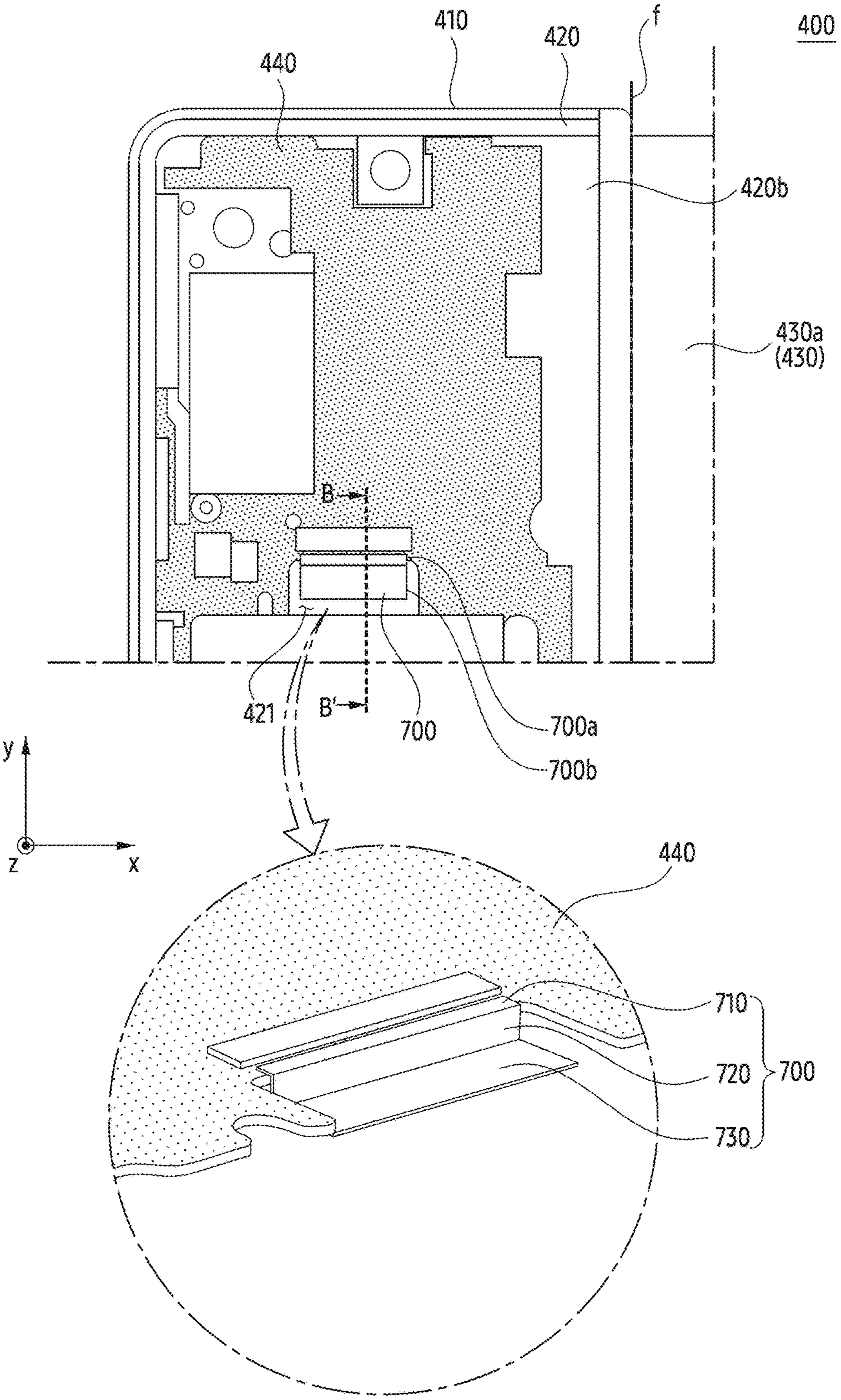
FIG. 7A is a top plan view of an electronic device according to an embodiment of the disclosure.

FIG. 7A is a top plan view of an electronic device according to an embodiment of the disclosure.

Figure 7B:
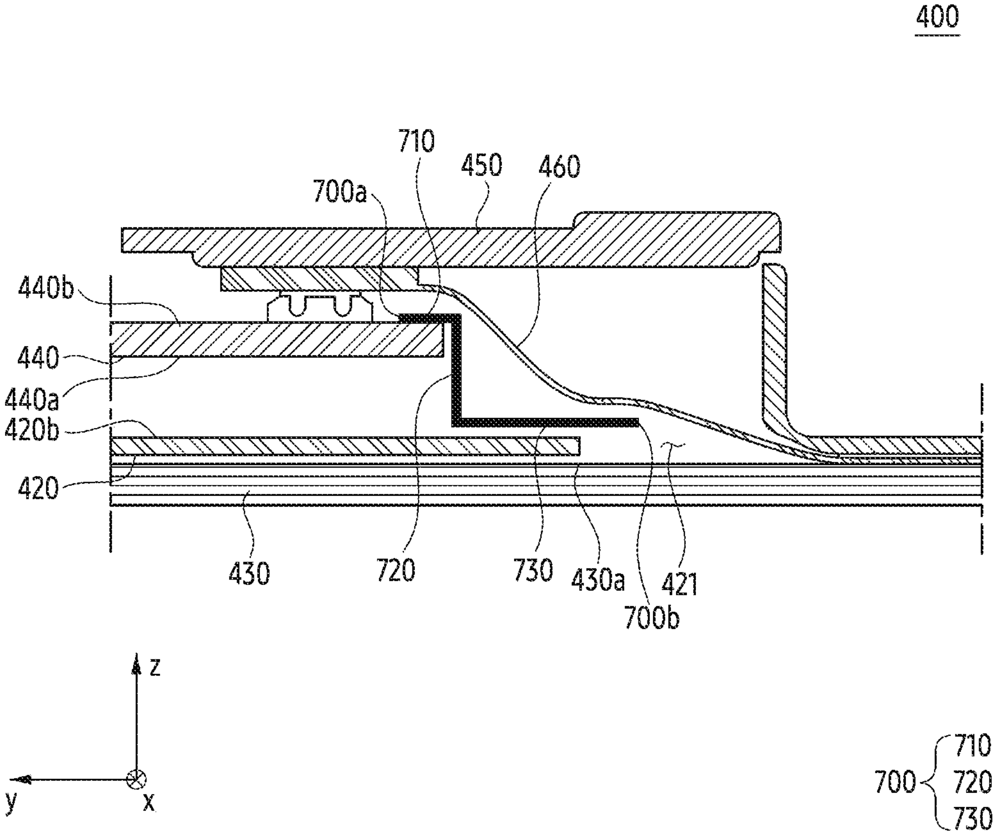
FIG. 7B is a cross-sectional view illustrating an electronic device cut along line B-B' of FIG. 7A according to an embodiment of the disclosure.

FIG. 7B is a cross-sectional view illustrating an electronic device cut along line B-B' of FIG. 7A according to an embodiment of the disclosure.

An electronic device 400 of FIGS. 7A and 7B may be an electronic device 400 in which a structure of a supporting portion 500 is changed in the electronic device 400 of FIGS. 4A, 4B, and/or 4C, and thus a redundant description thereof is omitted.

Referring to FIGS. 7A and 7B, the electronic device 400 according to an embodiment of the disclosure may include a supporting portion 700. The supporting portion 700 may support a flexible printed circuit board 460. The supporting portion 700 may be spaced apart from one surface 430*a* of a display 430. According to an embodiment of the disclosure, a part of the supporting portion 700 may be disposed on a printed circuit board 440. The supporting portion 700 may separate a part of the flexible printed circuit board 460 passing through a through hole 421 from the one surface 430*a* of the display 430. For example, the part of the supporting portion 700 disposed on the through hole 421 may prevent the part of the flexible printed circuit board 460 passing through the through hole 421 from contacting the one surface 430*a* of the display 430. For example, one end 700*a* of the supporting portion 700 may be coupled to the printed circuit board 440, and another end 700*b* of the supporting portion 700 opposite to the one end 700*a* of the supporting portion 700 may be disposed on the through hole 421. The one end 700*a* of the supporting portion 700 may be disposed on another surface 440*b* of the printed circuit board 440 opposite to one surface 440*a* of the printed circuit board 440 facing another surface 420*b* of a first bracket 420. The one end 700*a* of the supporting portion 700 may face a second bracket 450.

According to an embodiment of the disclosure, the supporting portion 700 may include a first connecting portion 710, a second connecting portion 720 connected to the first connecting portion 710, and a third connecting portion 730 connected to the second connecting portion 720. The first connecting portion 710 may extend from the one end 700*a* of the supporting portion 700 in a direction parallel to the other surface 420*b* of the first bracket 420. For example, the first connecting portion 710 may extend from the one end 700*a* of the supporting portion 700 in a direction parallel to the other surface 420*b* of the first bracket 420 on the other surface 440*b* of the printed circuit board 440. The second connecting portion 720 may extend in a direction perpendicular to the other surface 420*b* of the first bracket 420. The third connecting portion 730 may extend from the second connecting portion 720 in a direction parallel to the other surface 420*b* of the first bracket 420. The third connecting portion 730 may extend from the second connecting portion 720, and define the other end 700*b* of the supporting portion 700.

As described above, the electronic device 400 according to an embodiment of the disclosure may provide a structure capable of preventing damage of the display 430 due to the flexible printed circuit board 460, by the supporting portion 700 coupled to the printed circuit board 440.

Figure 8A:
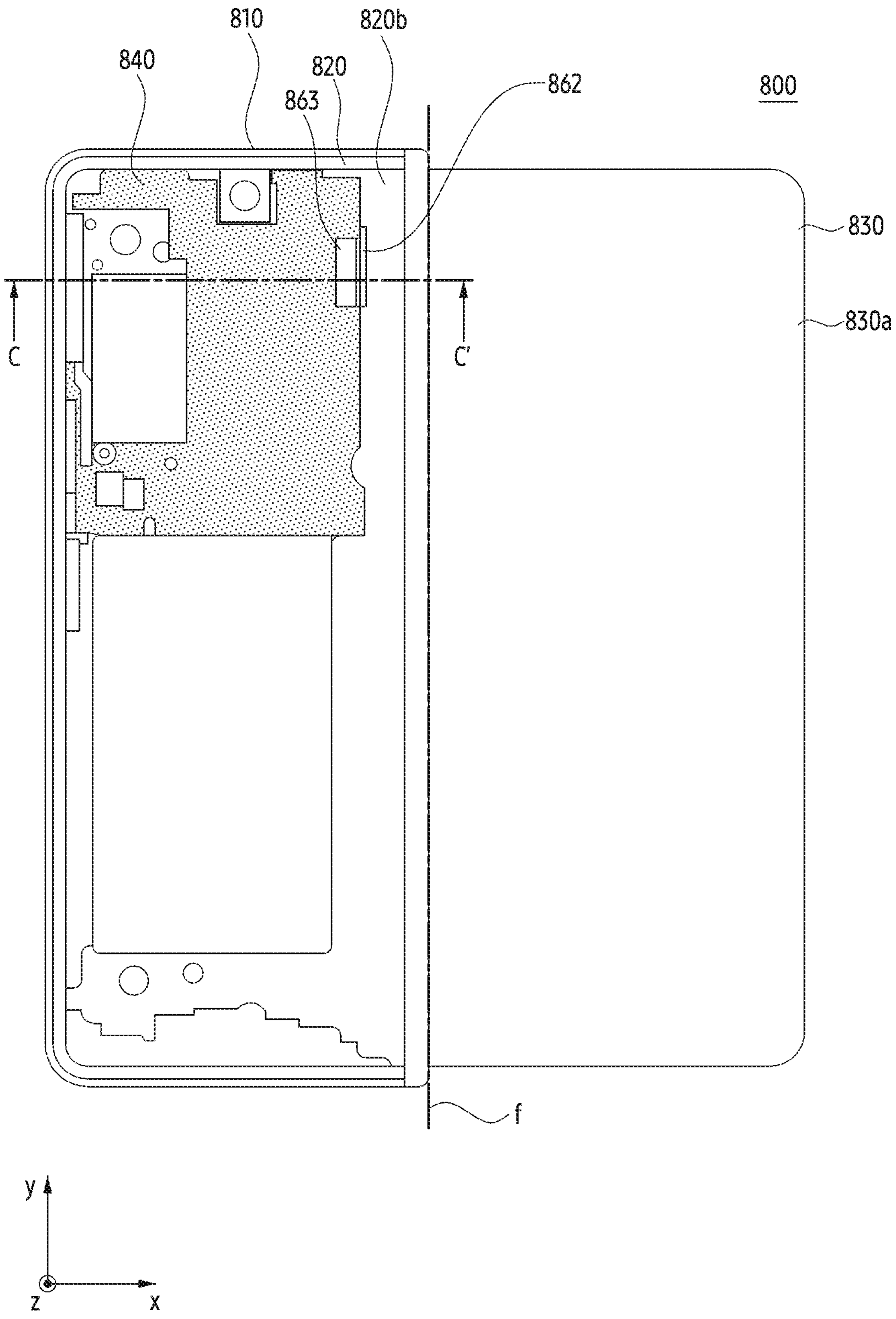
FIG. 8A is a top plan view of an electronic device according to an embodiment of the disclosure.

FIG. 8A is a top plan view of an electronic device according to an embodiment of the disclosure.

Figure 8B:
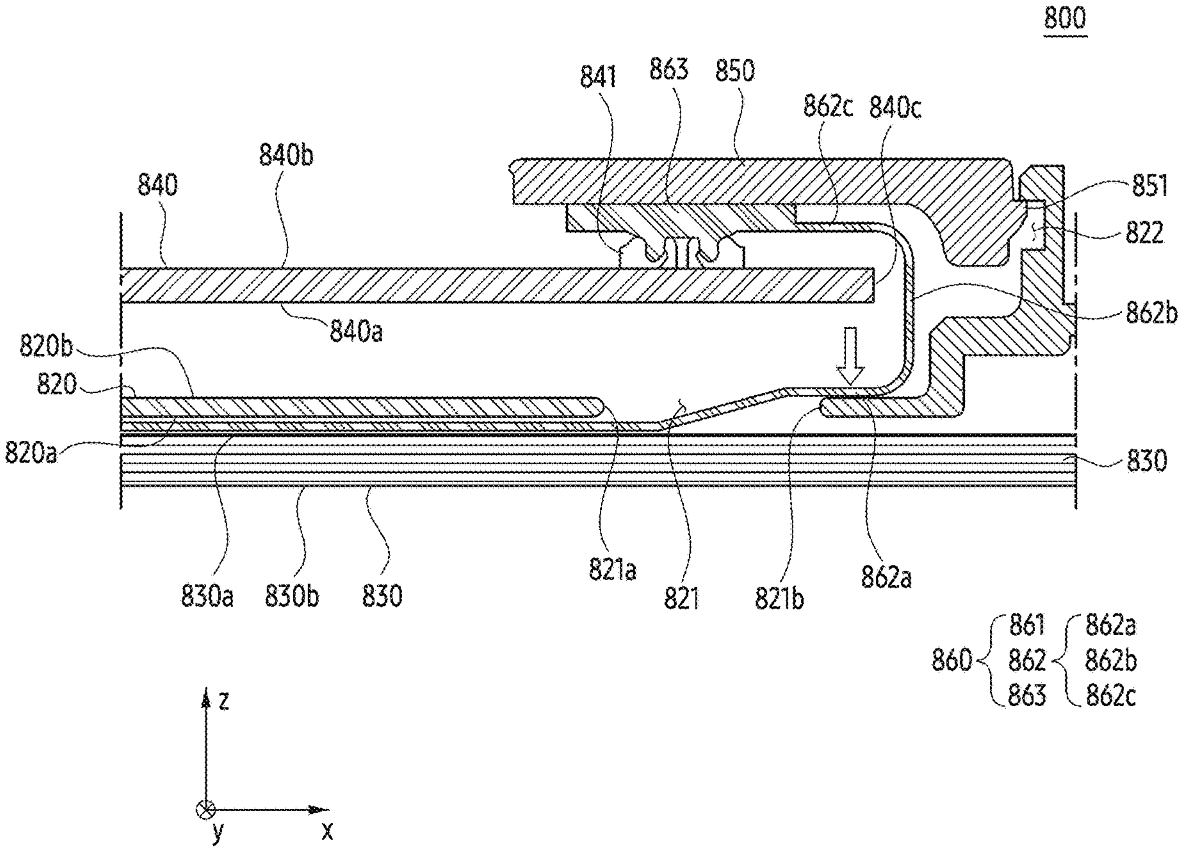
FIG. 8B is a cross-sectional view illustrating an electronic device cut along C-C' of FIG. 8A according to an embodiment of the disclosure.

FIG. 8B is a cross-sectional view illustrating an electronic device cut along C-C' of FIG. 8A according to an embodiment of the disclosure.

Referring to FIGS. 8A and 8B, an electronic device 800 (e.g., the electronic device 400 of FIGS. 4A, 4B, and 4C) according to an embodiment of the disclosure may include a first housing 810, a first bracket 820, a display 830, a printed circuit board 840, a second bracket 850, and/or a flexible printed circuit board 860. The first housing 810, the first bracket 820, the display 830, the printed circuit board 840, the second bracket 850, and/or the flexible printed circuit board 860 of FIGS. 8A and 8B may be substantially the same as the first housing 410, the first bracket 420, the display 430, the printed circuit board 440, the second bracket 450, and the flexible printed circuit board 460 of FIGS. 4A, 4B, and 4C, and thus a redundant description thereof is omitted.

According to an embodiment of the disclosure, the display 830 may be deformable by a movement of the first housing 810 with respect to the second housing (e.g., the second housing 320 of FIGS. 3A, 3B, and 3C). For example, the display 830 may be folded or unfolded by the movement of the first housing 810 with respect to the second housing 320. According to an embodiment of the disclosure, the first housing 810 may have a shape extending long along a folding axis f of the electronic device 800. The first housing 810 may have a length in a direction (e.g., +y direction or −y direction) parallel to the folding axis f. However, it is not limited thereto, and the first housing 410 may have a shape extending long in a direction perpendicular to the folding axis f.

According to an embodiment of the disclosure, the first bracket 820 may support components disposed inside the electronic device 800. For example, the first bracket 820 may be integrally formed with the first housing 810, but it is not limited thereto. For another example, the first bracket 820 may be defined as a separate member distinguished from the first housing 810.

According to an embodiment of the disclosure, the first bracket 820 may include a through hole 821. The through hole 821 may provide a passage for connecting a component (e.g., the display 830) disposed outside the first bracket 820 and a component (e.g., the printed circuit board 840) disposed inside the first bracket 820. For example, the through hole 821 may penetrate one surface 820*a* of the first bracket 820 and another surface 820*b* of the first bracket 820 opposite the one surface 820*a* of the first bracket 820. The one surface 820*a* of the first bracket 820 may mean a surface facing the outside of the electronic device 800 among surfaces of the first bracket 820. The other surface 820*b* of the first bracket 820 may mean a surface of the first bracket 820 facing the inside of the electronic device 800 among the surfaces of the first bracket 820. According to an embodiment of the disclosure, the through hole 821 may extend long in the direction (e.g., +y direction or −y direction) parallel to the folding axis f of the electronic device 800. For example, the through hole 821 may extend in the direction parallel to the folding axis f and have a substantially rectangular cross section, but it is not limited thereto. A first periphery 821*a* and a second periphery 821*b* of the through hole 821 may face each other and may be spaced apart from each other in the direction (e.g., +x direction or −x direction) perpendicular to the folding axis f. The first periphery 821*a* and the second periphery 821*b* of the through hole 821 may be parallel to each other.

According to an embodiment of the disclosure, the printed circuit board 840 may electrically connect a processor (e.g., the processor 120 of FIG. 1) disposed on the printed circuit board 840, and the display 830. According to an embodiment of the disclosure, the printed circuit board 840 may be disposed inside the first housing 810. The printed circuit board 840 may be spaced apart from the other surface 820*b* of the first bracket 820 opposite to the one surface 820*a* of the first bracket 820. For example, the printed circuit board 840 may be spaced apart from the other surface 820*b* of the first bracket 820 in a direction (e.g., +z direction) toward which the other surface 820*b* of the first bracket 820 faces.

According to an embodiment of the disclosure, the printed circuit board 840 may include a first connector 841. The first connector 841 may connect the flexible printed circuit board 860 and the printed circuit board 840. For example, the first connector 841 may be disposed on another surface 840*b* of the printed circuit board 840 opposite to one surface 840*a* of the printed circuit board 840 facing a through hole 821. For another example, the first connector 841 may be disposed on the other surface 840*b* of the printed circuit board 840 facing the second bracket 850.

According to an embodiment of the disclosure, the second bracket 850 may be coupled to the first bracket 820. The second bracket 850 may be spaced apart from the other surface 820*b* of the first bracket 820. According to an embodiment of the disclosure, the second bracket 850 may include a coupling protrusion 851. For example, the coupling protrusion 851 may vertically protrude in a direction (e.g., +x direction) toward which the other surface 820*b* of the first bracket 820 faces. According to an embodiment of the disclosure, the first bracket 820 may include a coupling groove 822 accommodating the coupling protrusion 851. The coupling groove 822 may be formed as a part of the first bracket 820 facing the second bracket 850 is dented. As the coupling protrusion 851 is accommodated in the coupling groove 822 and contacts an inner surface of the coupling groove 822, the first bracket 820 and the second bracket 850 may be coupled to each other.

According to an embodiment of the disclosure, the flexible printed circuit board 860 may electrically connect the display 830 and the printed circuit board 840. According to an embodiment of the disclosure, the flexible printed circuit board 860 may pass through the through hole 821 and extend from one surface 830*a* of the display 830 to the printed circuit board 840. According to an embodiment of the disclosure, the flexible printed circuit board 860 may include a first region 861, a second region 862 connected to the first region 861, and a second connector 863. The first region 861 may mean a part of the flexible printed circuit board 860 in contact with the one surface 830*a* of the display 830. The first region 861 may be parallel to the one surface 830*a* of the display 830.

According to an embodiment of the disclosure, the second region 862 may mean another part of the flexible printed circuit board 860 extending from the first region 861 to the printed circuit board 840. According to an embodiment of the disclosure, a part of the second region 862 may be vertically bent with respect to another part of the second region 862. For example, the second region 862 may include a first portion 862*a*, a second portion 862*b* connected to the first portion 862*a*, and a third portion 862*c* connected to the second portion 862*b*. The first portion 862*a* may be parallel to the other surface 820*b* of the first bracket 820. The second portion 862*b* may be perpendicular to the other surface 820*b* of the first bracket 820 by connecting to the first portion 862*a* vertically. The second portion 862*b* may face a side surface 840*c* of the printed circuit board 840 perpendicular to one surface 840*a* of the printed circuit board 840. The third portion 862*c* may be parallel to the other surface 820*b* of the first bracket 820 by connecting to the second portion 862*b* vertically. The third portion 862*c* may extend on the other surface 840*b* of the printed circuit board 840.

According to an embodiment of the disclosure, the second connector 863 may be disposed at one end of the second region 862 facing the printed circuit board 840, and may be coupled to the first connector 841 of the printed circuit board 840. For example, the second connector 863 may be connected to the third portion 862*c*. The second connector 863 may face one surface of the second bracket 850 facing the other surface 840*b* of the printed circuit board 840.

According to an embodiment of the disclosure, a part of the other surface 820*b* of the first bracket 820 may be spaced apart from one surface 430*a* of the display 430. The part of the other surface 820*b* of the first bracket 820 may define the second periphery 821*b* of the through hole 821. According to an embodiment of the disclosure, the part of the other surface 820*b* of the first bracket 820 may be in contact with the second region 862 of the flexible printed circuit board 860 to separate the second region 862 from the one surface 830*a* of the display 830.

According to an embodiment of the disclosure, the part of the other surface 820*b* of the first bracket 820 may be in contact with the first portion 862*a* of the flexible printed circuit board 860. The part of the other surface 820*b* of the first bracket 820 may be in contact with the first portion 862*a* of the flexible printed circuit board 860 and may separate the flexible printed circuit board 860 from the display 830. For example, the flexible printed circuit board 860 may be bent approximately vertically at a boundary between the first portion 862*a* and the second portion 862*b*. In case that the part of the other surface 820*b* of the first bracket 820 does not support the first portion 862*a*, as the flexible printed circuit board 860 is bent, applied force of the first portion 862*a* may move the first portion 862*a* in a direction (e.g., −z direction) approaching the one surface 830*a* of the display 830. When the first portion 862*a* presses the display 830 by contacting the one surface 830*a* of the display 830, the display 830 may not smoothly provide visual information to a user. According to an embodiment of the disclosure, the electronic device 800, by the part of the other surface 820*b* of the first bracket 820 supporting the flexible printed circuit board 860, may provide a structure capable of preventing damage of the display 830.

As described above, the electronic device 800 according to an embodiment of the disclosure may provide a structure capable of preventing damage of the display 830 without a separate member, by a part of the other surface 820*b* of the first bracket 820 supporting the flexible printed circuit board 860. According to an embodiment of the disclosure, the electronic device 800 may provide a structure in which an inner space for arranging other components is expanded, by the part of the other surface 820*b* of the first bracket 820 supporting the flexible printed circuit board 860.

According to an embodiment of the disclosure, an electronic device (e.g., the electronic device 400 of FIGS. 4A, 4B, and 4C) may comprise a bracket (e.g., the first bracket 420 of FIGS. 4A, 4B, and 4C) including one surface (e.g., the one surface 420*a* of FIG. 4C) facing outside of the electronic device, another surface (e.g., the other surface 420*b* of FIG. 4C) facing inside of the electronic device and opposite to the one surface, and a through-hole (e.g., the through hole 421 of FIGS. 4A, 4B, and 4C) extending from the one surface to the other surface. According to an embodiment of the disclosure, the electronic device may comprise a display (e.g., the display 430 of FIGS. 4A, 4B, and 4C) disposed on the one surface of the bracket, a printed circuit board (e.g., the printed circuit board 440 of FIGS. 4A, 4B, and 4C) spaced apart from the other surface of the bracket and disposed inside the bracket. According to an embodiment of the disclosure, the electronic device may comprise a flexible printed circuit board (e.g., the flexible printed circuit board 460 of FIGS. 4A, 4B, and 4C) passing through the through hole and extending from one surface of the display facing the one surface of the bracket to the printed circuit board. According to an embodiment of the disclosure, when the display is viewed from above, the electronic device may comprise a supporting portion (e.g., the supporting portion 500 of FIGS. 4A, 4B, and 4C) partially overlapped at the through hole and spaced apart from the one surface of the display. According to an embodiment of the disclosure, the supporting portion, when the display is viewed from above, may overlap a part of the flexible printed circuit board (e.g., the second region 462 of the flexible printed circuit board 460 of FIG. 4C) and may separate the part of the flexible printed circuit board passing through the though hole from the one surface of the display.

According to an embodiment of the disclosure, the supporting portion include a first supporting portion (e.g., the first supporting portion 510 of FIG. 4C) being in contact with the other surface of the bracket and partially disposed between the display and the printed circuit board. According to an embodiment of the disclosure, the supporting portion include a second supporting portion (e.g., the second supporting portion 520 of FIG. 4C) connected to the first supporting portion, disposed inside the through hole defining a periphery (e.g., the first periphery 421*a* of FIG. 4C) of the through hole, and being in contact with the part of the flexible printed circuit board.

According to an embodiment of the disclosure, a thickness of the second supporting portion may be greater than a thickness of the first supporting portion.

According to an embodiment of the disclosure, the electronic device may further comprise a second bracket (e.g., the second bracket 450 of FIG. 4C) distinct from the first bracket that is the bracket and disposed on the other surface of the first bracket. According to an embodiment of the disclosure, the electronic device may further comprise a fixing portion (e.g., the fixing portion 600 of FIG. 6) extending from one surface of the second bracket that faces the other surface of the first bracket in a direction perpendicular to the other surface of the first bracket and pressing the flexible printed circuit board.

According to an embodiment of the disclosure, the fixing portion may be integrally formed with the second bracket.

According to an embodiment of the disclosure, the supporting portion may be integrally formed with the bracket.

According to an embodiment of the disclosure, the flexible printed circuit board may include a first region (e.g., the first region 461 of FIG. 4C) in contact with the one surface of the display and parallel to the one surface of the display. According to an embodiment of the disclosure, the flexible printed circuit board may include a second region (e.g., the second region 462 of FIG. 4C) that has a slope with respect to the one surface of the display, passes through the through hole, and extends from the first region to the printed circuit board. According to an embodiment of the disclosure, the first region may be spaced apart from the through hole and the printed circuit board when the display is viewed from above.

According to an embodiment of the disclosure, the supporting portion may include a supporting protrusion (e.g., the supporting protrusion 530 of FIGS. 5A and 5B) extending in a direction perpendicular to one surface of the supporting portion facing the other surface of the bracket. According to an embodiment of the disclosure, the bracket may further include a supporting groove (e.g., the supporting groove 420*c* of FIGS. 5A and 5B) disposed on the other surface of the bracket and extending in a direction perpendicular to the other surface to accommodating the supporting protrusion.

According to an embodiment of the disclosure, a width of the supporting portion may be longer than a width of the through hole. According to an embodiment of the disclosure, a part of the supporting portion may be in contact with a part of the other surface of the bracket surrounding the through hole.

According to an embodiment of the disclosure, the bracket may include an extending portion (e.g., the extending portion 422 of FIGS. 4B and 4C) extending in a direction parallel to the one surface of the display and defining the other surface and the through hole of the bracket. According to an embodiment of the disclosure, the bracket may include a barrier portion (e.g., the barrier portion 423 of FIGS. 4B and 4C) extending from a second periphery of the through hole facing a first periphery (e.g., the first periphery 421*a* of FIG. 4C) of the through hole on which the supporting portion is disposed, in a direction toward which the one surface of the display faces.

According to an embodiment of the disclosure, one surface (e.g., the one surface 423*a* of FIGS. 4B and 4C) of the barrier portion may face the portion of the flexible printed circuit board and may be chamfered.

According to an embodiment of the disclosure, one end (e.g., the one end 700*a* of FIGS. 7A and 7B) of the supporting portion may be disposed on one surface of the printed circuit board. According to an embodiment of the disclosure, the other end of the supporting portion (e.g., the other end 700*b* of FIGS. 7A and 7B) may overlap the through hole when the display is viewed from above.

According to an embodiment of the disclosure, the supporting portion may include a first connection portion (e.g., the first connection portion 710 of FIGS. 7A and 7B) extending from one end of the supporting portion in a direction parallel to the other surface of the bracket. According to an embodiment of the disclosure, the supporting portion may include a second connection portion (e.g., the second connection portion 720 of FIGS. 7A and 7B) connected to the first connection portion and extending in a direction perpendicular to the other surface of the bracket. According to an embodiment of the disclosure, the supporting portion may include a third connection portion (e.g., the third connection portion 730 of FIGS. 7A and 7B) on which the other end of the supporting portion is disposed, connected to the second connection portion, and extending in a direction parallel to the other surface of the bracket.

According to an embodiment of the disclosure, the electronic device may further comprise a display driving circuit operatively coupled to the display. The display driving circuit may be configured to display visual information through the display based on receiving a signal through the flexible printed circuit.

According to an embodiment of the disclosure, the electronic device may further comprise sensor circuitry configured to detect an input from the other surface of the display facing the one surface of the display. According to an embodiment of the disclosure, the flexible printed circuit board may transmit a signal obtained from the sensor circuitry to the printed circuit board.

According to an embodiment of the disclosure, an electronic device (e.g., electronic devices 400 of FIGS. 4A, 4B, and 4C) may include a first housing (e.g., the first housing 310 of FIGS. 3A, 3B, and 3C) including a first surface (e.g., the first surface 311 of FIGS. 3A, 3B, and 3C) and a second surface (e.g., the second surface 312 of FIGS. 3A, 3B, and 3C) that faces the first surface and is spaced apart from the first surface, and a second housing (e.g., the second housing 320 of FIGS. 3A, 3B, and 3C) including a third surface (e.g., the third surface 321 of FIGS. 3A, 3B, and 3C) and a fourth surface (e.g., the fourth surface 322 of FIGS. 3A, 3B, and 3C) that faces the third surface and is spaced apart from the third surface. According to an embodiment of the disclosure, the electronic device may include a hinge structure (e.g., the hinge structure 350 of FIGS. 3A, 3B, and 3C) capable of switching to an unfolding state in which a direction in which the first surface faces and a direction in which the third surface faces are the same or a folding state in which the first surface and the third surface face each other, by movably connecting the first housing and the second housing, and a display (e.g., the display 330 of FIGS. 3A, 3B, and 3C) disposed on the first surface, the third surface, and the hinge structure. According to an embodiment of the disclosure, the electronic device may include a bracket (e.g., the first bracket 420 of FIGS. 4A, 4B, and 4C) including one surface (e.g., the one surface 420*a* of FIG. 4C) facing outside of the first housing and is in contact with the display, another surface (e.g., the other surface 420*b* of FIG. 4C) facing inside of the first housing and is opposite to the one surface, and a through hole (e.g., the through hole 421 of FIGS. 4A, 4B, and 4C) penetrating the one surface and the other surface, wherein the bracket being connected to the first housing. According to an embodiment of the disclosure, the electronic device may include a printed circuit board (e.g., the printed circuit board 440 of FIGS. 4A, 4B, and 4C) spaced apart from the other surface of the bracket in a direction toward which the other surface of the bracket faces. According to an embodiment of the disclosure, the electronic device may include a flexible printed circuit board including a first region (e.g., the first region 861 of FIGS. 8A and 8B) being in contact with the one surface of the display facing the one surface of the bracket, and a second region (e.g., the second region 862 of FIGS. 8A and 8B) passing through the through hole and extending from the first region to the printed circuit board, and at least partially bent on the other surface of the bracket. According to an embodiment of the disclosure, a part of the other surface of the bracket may be spaced apart from the one surface of the display and may separate the second region from the one surface of the display by being in contact with the second region.

According to an embodiment of the disclosure, the part of the other surface of the bracket may be disposed at a second periphery (e.g., the second periphery 821*b* of FIGS. 8A and 8B) spaced apart from a first periphery (e.g., the first periphery 821*a* of FIGS. 8A and 8B) of the through hole facing the first region.

According to an embodiment of the disclosure, the printed circuit board may include a first connector (e.g., the first connector 841 of FIGS. 8A and 8B) disposed on the other surface of the printed circuit board opposite to one surface of the printed circuit board facing the through hole. According to an embodiment of the disclosure, the flexible printed circuit board may further include a second connector (e.g., the second connector 863 of FIGS. 8A and 8B) disposed at one end of the second region and coupled to the first connector.

According to an embodiment of the disclosure, the electronic device may further include a second bracket (e.g., the second bracket 850 of FIGS. 8A and 8B) including a coupling protrusion (e.g., the coupling protrusion 851 of FIGS. 8A and 8B) distinct from the first bracket that is the bracket and protruding in a direction parallel to the other surface of the first bracket, and disposed on the other surface of the first bracket. According to an embodiment of the disclosure, the first bracket may further include a coupling groove (e.g., the coupling groove 822 of FIGS. 8A and 8B) formed by a part of the first bracket facing the coupling protrusion being dented, and surrounding the coupling protrusion.

According to an embodiment of the disclosure, the electronic device may further include sensor circuitry configured to identify an input from the other surface of the display facing the one surface of the display. According to an embodiment of the disclosure, the flexible printed circuit board may electrically connect the sensor circuitry to the printed circuit board.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as “A or B,” “at least one of A and B,” “at least one of A or B,” “A, B, or C,” “at least one of A, B, and C,” and “at least one of A, B, or C,” may include any one of or all possible combinations of the items enumerated together in a corresponding one of the phrases. As used herein, such terms as “1st” and “2nd,” or “first” and “second” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” or “connected with” another element (e.g., a second element), it means that the element may be coupled with the other element directly (e.g., wiredly), wirelessly, or via a third element.

As used in connection with various embodiments of the disclosure, the term “module” may include a unit implemented in hardware, software, or firmware, and may interchangeably be used with other terms, for example, “logic,” “logic block,” “part,” or “circuitry”. A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term “non-transitory” simply means that the storage medium is a tangible device, and does not include a signal (e.g., an electromagnetic wave), but this term does not differentiate between a case in which data is semi-permanently stored in the storage medium and a case in which the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

It will be appreciated that various embodiments of the disclosure according to the claims and description in the specification can be realized in the form of hardware, software or a combination of hardware and software.

Any such software may be stored in non-transitory computer readable storage media. The non-transitory computer readable storage media store one or more computer programs (software modules), the one or more computer programs include computer-executable instructions that, when executed by one or more processors of an electronic device, cause the electronic device to perform a method of the disclosure.

Any such software may be stored in the form of volatile or non-volatile storage, such as, for example, a storage device like read only memory (ROM), whether erasable or rewritable or not, or in the form of memory, such as, for example, random access memory (RAM), memory chips, device or integrated circuits or on an optically or magnetically readable medium, such as, for example, a compact disk (CD), digital versatile disc (DVD), magnetic disk or magnetic tape or the like. It will be appreciated that the storage devices and storage media are various embodiments of non-transitory machine-readable storage that are suitable for storing a computer program or computer programs comprising instructions that, when executed, implement various embodiments of the disclosure. Accordingly, various embodiments provide a program comprising code for implementing apparatus or a method as claimed in any one of the claims of this specification and a non-transitory machine-readable storage storing such a program.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

a bracket including one surface facing outside of the electronic device, another surface facing inside of the electronic device and opposite to the one surface, and a through hole penetrating the one surface and the other surface;

a display disposed on the one surface of the bracket;

a printed circuit board spaced apart from the other surface of the bracket in a direction toward which the other surface of the bracket faces;

a flexible printed circuit board passing through the through hole and extending from one surface of the display facing the one surface of the bracket to the printed circuit board; and a supporting portion partially disposed on the through hole and spaced apart from the one surface of the display, wherein the supporting portion is in contact with a part of the flexible printed circuit board, and wherein the supporting portion separates the part of the flexible printed circuit board passing through the through hole from the one surface of the display.

2. The electronic device of claim 1, wherein the supporting portion includes:

a first supporting portion being in contact with the other surface of the bracket and partially disposed between the display and the printed circuit board; and a second supporting portion connected to the first supporting portion, disposed inside the through hole, and being in contact with the part of the flexible printed circuit board.

3. The electronic device of claim 2, wherein a thickness of the second supporting portion is greater than a thickness of the first supporting portion.

4. The electronic device of claim 1, further comprising:

a second bracket distinct from a first bracket that is the bracket, and coupled to the first bracket on the other surface of the first bracket; and a fixing portion, extending from one surface of the second bracket that faces the other surface of the first bracket in a direction facing the other surface of the first bracket, and being in contact with the flexible printed circuit board.

5. The electronic device of claim 4, wherein the fixing portion is formed integrally with the second bracket.

6. The electronic device of claim 1, wherein the supporting portion is formed integrally with the bracket.

7. The electronic device of claim 1, wherein the flexible printed circuit board includes:

a first region being in contact with the one surface of the display and parallel to the one surface of the display, and a second region extending from the first region to the printed circuit board, wherein at least a part of the second region is inclined with respect to the one surface of the display and passes through the through hole, and wherein the first region is spaced apart from the printed circuit board when viewing the display from above.

8. The electronic device of claim 1, wherein the supporting portion includes a supporting protrusion protruding from one surface of the supporting portion facing the other surface of the bracket, and wherein the bracket further includes a supporting groove disposed on the other surface of the bracket and receiving the supporting protrusion.

9. The electronic device of claim 1, wherein a width of the supporting portion is greater than a width of the through hole, and wherein a part of the supporting portion is in contact with a part of the other surface of the bracket surrounding the through hole.

10. The electronic device of claim 1, wherein the bracket includes:

an extending portion extending in a direction parallel to the one surface of the display, and defining the other surface of the bracket and the through hole; and a barrier portion extending from a second periphery of the through hole facing a first periphery of the through hole on which the supporting portion is disposed, in a direction perpendicular to the one surface of the display.

11. The electronic device of claim 10, wherein one surface of the barrier portion faces the part of the flexible printed circuit board and has a slope with respect to the one surface of the display.

12. The electronic device of claim 1, wherein one end of the supporting portion is coupled to the printed circuit board, and wherein another end of the supporting portion is disposed on the through hole.

13. The electronic device of claim 12, wherein the supporting portion includes:

a first connecting portion extending from the one end of the supporting portion in a direction parallel to the other surface of the bracket;

a second connecting portion connected to the first connecting portion and extending in a direction perpendicular to the other surface of the bracket; and a third connecting portion on which the other end of the supporting portion is disposed, connected to the second connecting portion, and extending in a direction parallel to the other surface of the bracket.

14. The electronic device of claim 1, further comprising:

a display driving circuit operatively coupled to the display, wherein the flexible printed circuit board electrically connects the display driving circuit to the printed circuit board.

15. The electronic device of claim 1, further comprising:

sensor circuitry configured to detect an input from another surface of the display facing the one surface of the display, wherein the flexible printed circuit board electrically connects the sensor circuitry to the printed circuit board.

16. An electronic device comprising:

a first housing including a first surface and a second surface that faces the first surface and is spaced apart from the first surface;

a second housing including a third surface and a fourth surface that faces the third surface and is spaced apart from the third surface;

a hinge structure capable of switching to an unfolding state in which a direction in which the first surface faces and a direction in which the third surface faces are the same or a folding state in which the first surface and the third surface face each other, by rotatably coupling the first housing and the second housing;

a display disposed on the first surface and the third surface across the hinge structure;

a bracket including one surface that faces outside of the first housing and is in contact with the display, another surface that faces inside of the first housing and is opposite to the one surface, and a through hole penetrating the one surface and the other surface, wherein the bracket is coupled to the first housing;

a printed circuit board spaced apart from the other surface of the bracket in a direction toward which the other surface of the bracket faces; and a flexible printed circuit board including a first region being in contact with one surface of the display facing the one surface of the bracket, and a second region passing through the through hole and extending from the first region to the printed circuit board, wherein at least a portion of the second region is bent on the other surface of the bracket, and wherein a part of the other surface of the bracket is spaced apart from the one surface of the display and separates the second region from the one surface of the display by being in contact with the second region.

17. The electronic device of claim 16, wherein the part of the other surface of the bracket is disposed at a second periphery of the through hole spaced apart from a first periphery of the through hole facing the first region.

18. The electronic device of claim 17, wherein the printed circuit board includes a first connector disposed on another surface of the printed circuit board opposite to one surface of the printed circuit board facing the through hole, and wherein the flexible printed circuit board further includes a second connector disposed at one end of the second region and coupled to the first connector.

19. The electronic device of claim 16, further comprising:

a second bracket, distinct from a first bracket that is the bracket, including a coupling protrusion protruding perpendicularly to a direction in which the other surface of the first bracket faces, and spaced from the other surface of the first bracket, wherein the first bracket further includes a coupling groove, formed by a part of the first bracket facing the coupling protrusion being dented, and receiving the coupling protrusion.

20. The electronic device of claim 16, further comprising:

sensor circuitry configured to detect an input from the other surface of the display facing the one surface of the display, wherein the flexible printed circuit board electrically connects the sensor circuitry to the printed circuit board.

* * * * *